(12) United States Patent
Ogawa et al.

(10) Patent No.: US 8,950,734 B2
(45) Date of Patent: Feb. 10, 2015

(54) OPERATING DEVICE AND MOVING APPARATUS INCLUDING OPERATING DEVICE

(75) Inventors: Kouji Ogawa, Kasugai (JP); Fujioki Yamaguchi, Kasugai (JP)

(73) Assignee: Gogou Co., Ltd., Aichi (JP)

( * ) Notice: Subject to any disclaimer, the term of this patent is extended or adjusted under 35 U.S.C. 154(b) by 63 days.

(21) Appl. No.: 13/389,393

(22) PCT Filed: Jul. 1, 2011

(86) PCT No.: PCT/JP2011/003787
§ 371 (c)(1),
(2), (4) Date: Feb. 7, 2012

(87) PCT Pub. No.: WO2012/001994
PCT Pub. Date: Jan. 5, 2012

(65) Prior Publication Data
US 2012/0132605 A1 May 31, 2012

(30) Foreign Application Priority Data

Jul. 2, 2010 (WO) .................. PCT/JP2010/004369
Mar. 31, 2011 (JP) ................................ 2011-093474

(51) Int. Cl.
*B66D 1/48* (2006.01)
*B66C 13/44* (2006.01)

(52) U.S. Cl.
CPC ........................................ *B66C 13/44* (2013.01)
USPC ........................................... 254/269; 254/267

(58) Field of Classification Search
USPC .......... 254/266, 273, 275, 264, 267, 269, 271
See application file for complete search history.

(56) References Cited

U.S. PATENT DOCUMENTS

| | | | | |
|---|---|---|---|---|
| 2,989,288 A | * | 6/1961 | Smith | 254/334 |
| 3,552,720 A | * | 1/1971 | McKendrick | 254/264 |
| 3,998,432 A | * | 12/1976 | Uldricks et al. | 254/386 |
| 4,900,286 A | * | 2/1990 | Buffalo | 446/30 |
| 5,565,891 A | * | 10/1996 | Armstrong | 345/167 |
| 5,624,117 A | * | 4/1997 | Ohkubo et al. | 273/148 B |

(Continued)

FOREIGN PATENT DOCUMENTS

| | | |
|---|---|---|
| EP | 2119662 A1 | 11/2009 |
| GB | 2030004 A | 3/1980 |

(Continued)

OTHER PUBLICATIONS

International Search Report for PCT Patent App. No. PCT/JP2011/003787 (Sep. 20, 2011).

*Primary Examiner* — Emmanuel M Marcelo
*Assistant Examiner* — Michael Gallion
(74) *Attorney, Agent, or Firm* — Cermak Nakajima & McGowan LLP; Tomoko Nakajima

(57) ABSTRACT

The present invention provides techniques relating to an operating device exhibiting superior dust resistance and water resistance, and more particularly to an operating device exhibiting few design restrictions and a small assembly operation load, and to a moving apparatus including the operating device.

In an operating device having, in a casing, a detection unit for detecting input relating to an instruction to operate a driving device that drives movement of an object, a plurality of the detection units are arranged over a partial or entire range of a circumference of the casing in accordance with movement directions of the object.

11 Claims, 19 Drawing Sheets

(56) References Cited

U.S. PATENT DOCUMENTS

| | | | |
|---|---|---|---|
| 5,850,928 A * | 12/1998 | Kahlman et al. | 212/285 |
| 5,865,426 A * | 2/1999 | Kazerooni | 254/270 |
| 6,386,513 B1 * | 5/2002 | Kazerooni | 254/270 |
| 6,554,252 B2 * | 4/2003 | Kazerooni et al. | 254/270 |
| 6,595,493 B2 * | 7/2003 | Krebs et al. | 254/266 |
| 6,634,621 B2 * | 10/2003 | Keith | 254/270 |
| 6,916,015 B2 * | 7/2005 | Andreasson | 254/270 |
| D543,003 S * | 5/2007 | Helmetsie | D34/35 |
| 7,334,776 B2 * | 2/2008 | Kazerooni | 254/270 |
| 7,766,718 B2 * | 8/2010 | Rago et al. | 446/242 |
| 7,810,791 B2 * | 10/2010 | DeVos | 254/270 |
| 8,157,113 B2 * | 4/2012 | Golder | 212/284 |
| 8,226,484 B2 * | 7/2012 | Bryant et al. | 463/39 |
| 8,465,005 B2 * | 6/2013 | Givens | 254/93 R |
| 8,584,549 B2 * | 11/2013 | Cheng et al. | 74/500.5 |
| 2002/0166267 A1 * | 11/2002 | McGugan | 37/348 |
| 2006/0226106 A1 * | 10/2006 | Zaguroli | 212/331 |
| 2010/0145526 A1 * | 6/2010 | Yamaguchi et al. | 700/275 |

FOREIGN PATENT DOCUMENTS

| | | |
|---|---|---|
| JP | 61-101923 A | 5/1986 |
| JP | 61-44797 B | 10/1986 |
| JP | 04-069176 A | 3/1992 |
| JP | 2005-089051 A | 4/2005 |
| JP | 2007-039232 A | 2/2007 |
| JP | 2011162357 A * | 8/2011 |
| WO | WO2008/099611 A1 | 8/2008 |

* cited by examiner

FIG.13
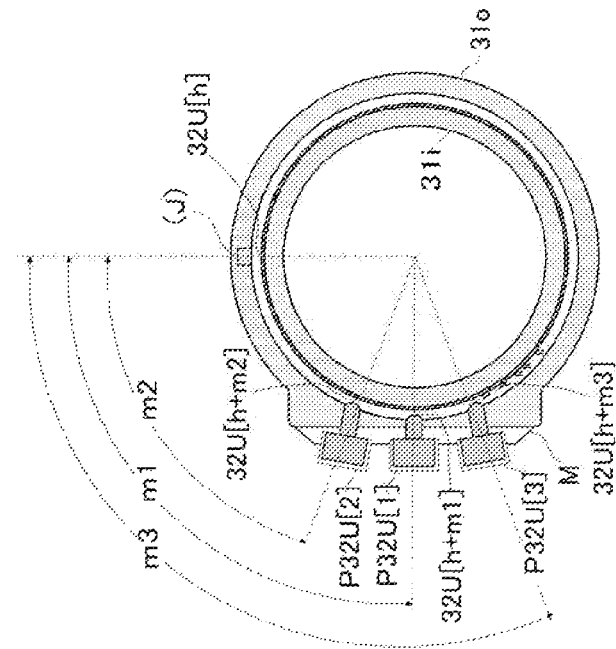
(b)
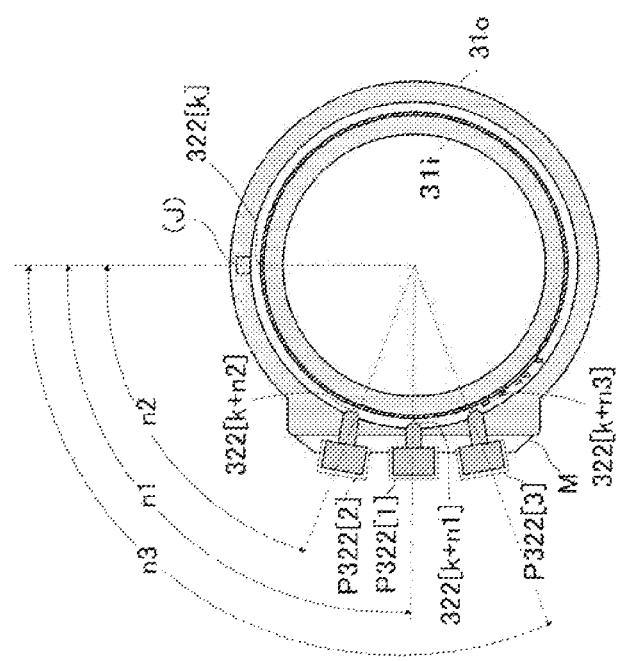
(a)

F I G.14
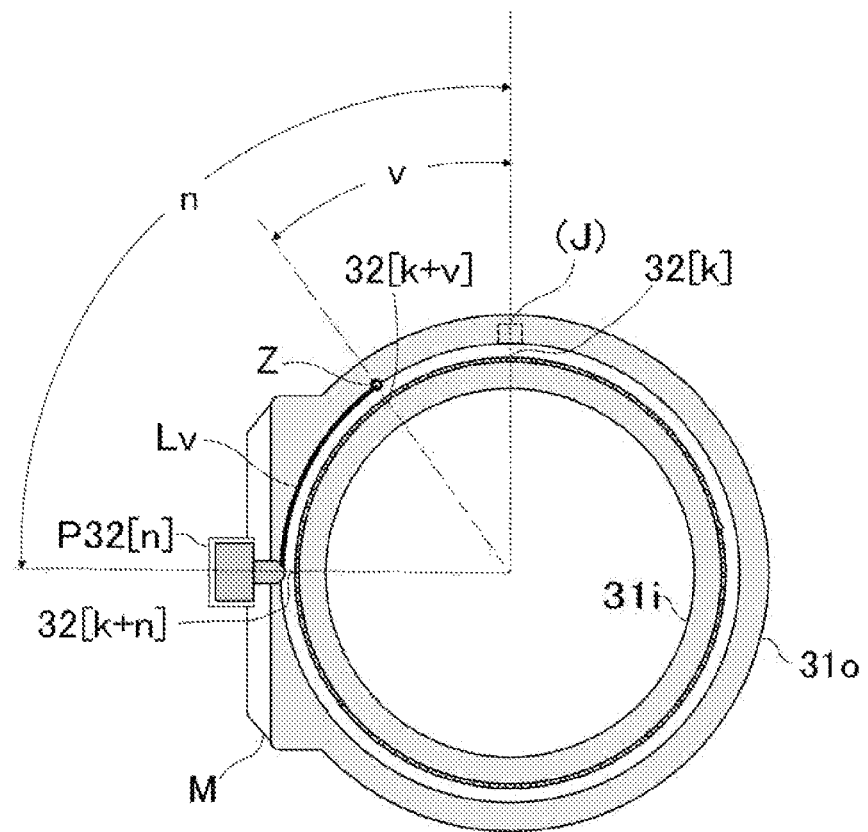

F I G.16
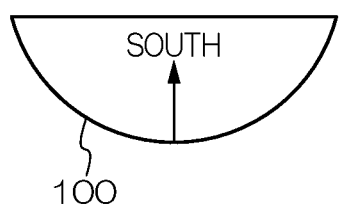
F I G.17
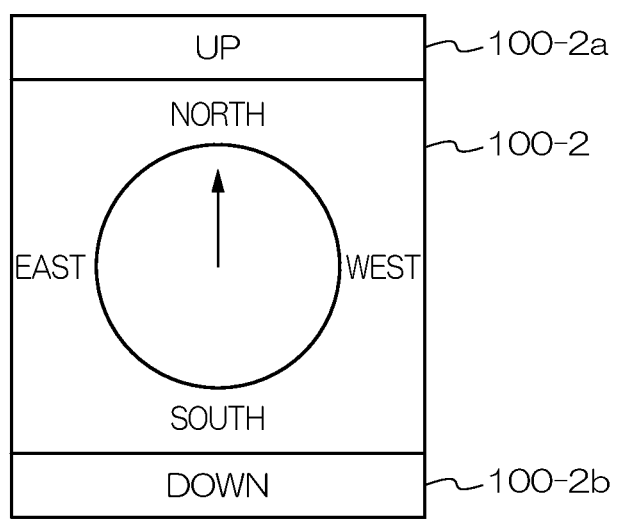

FIG.18
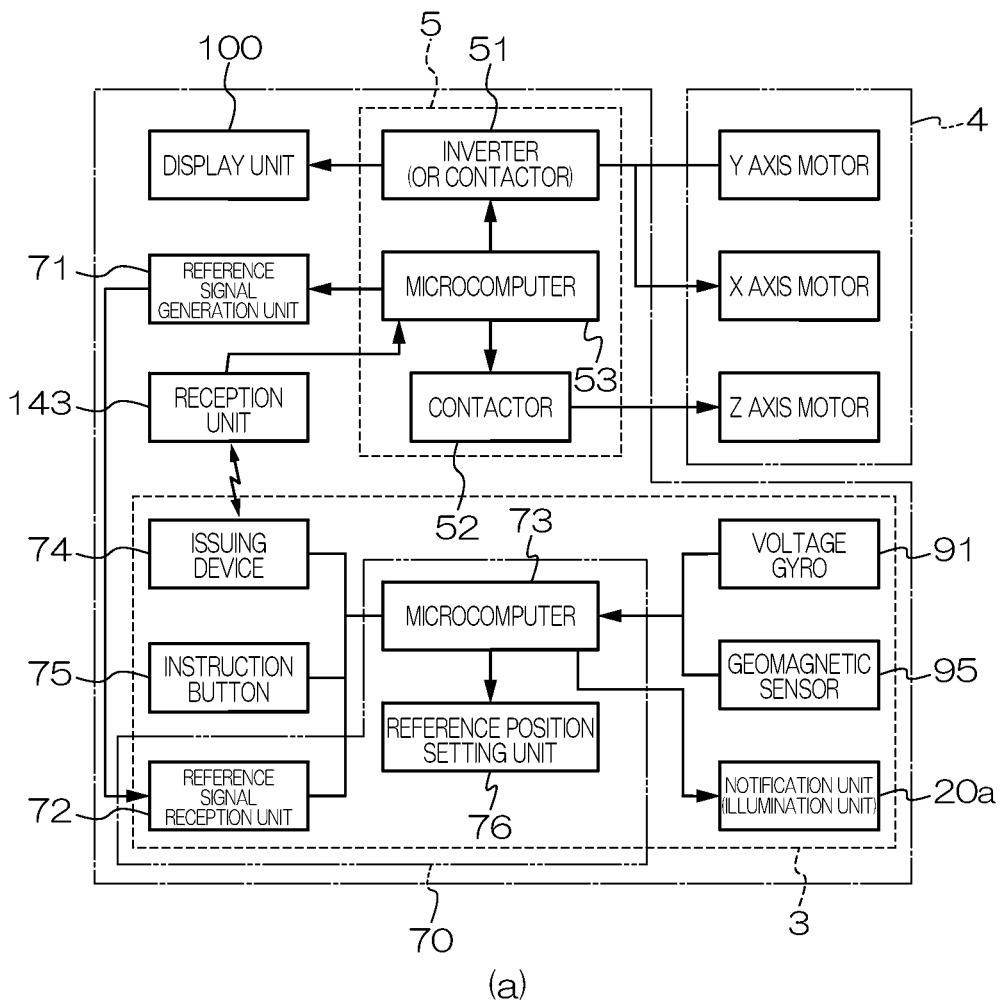
(a)
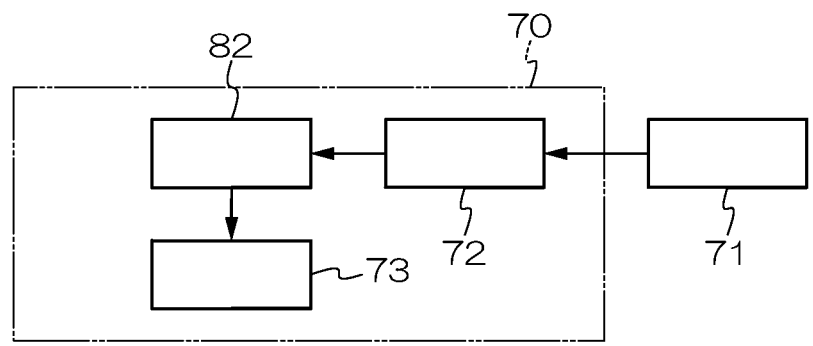
(b)

F I G.19
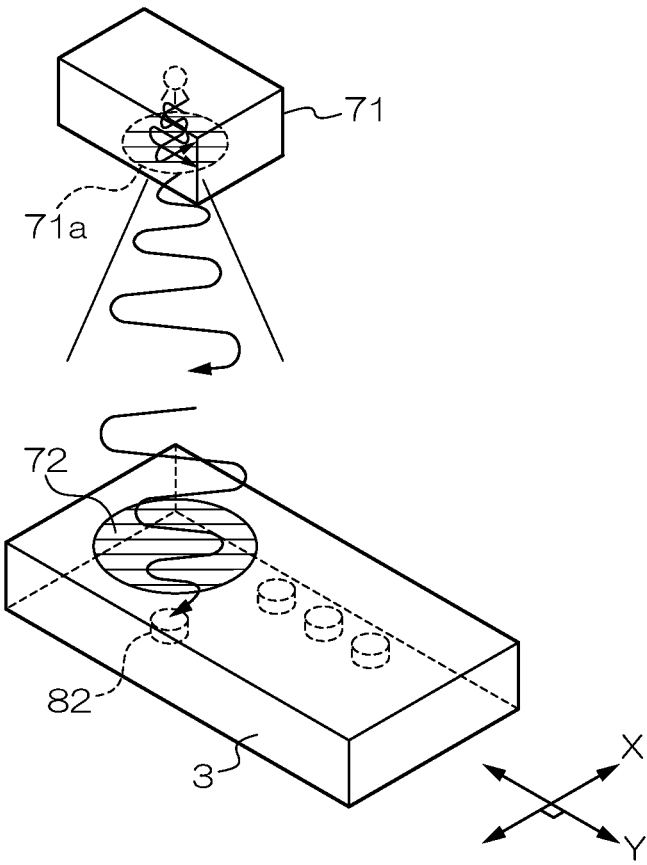
F I G.20
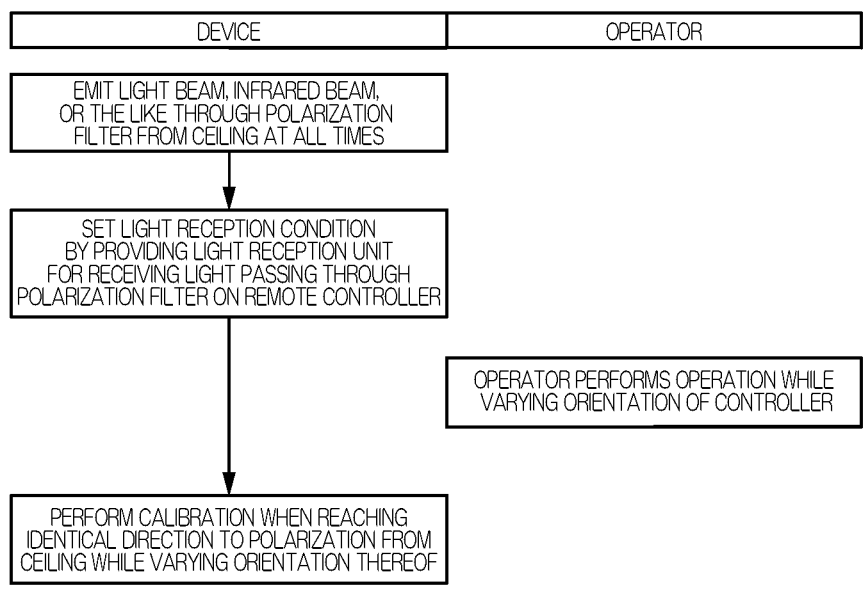

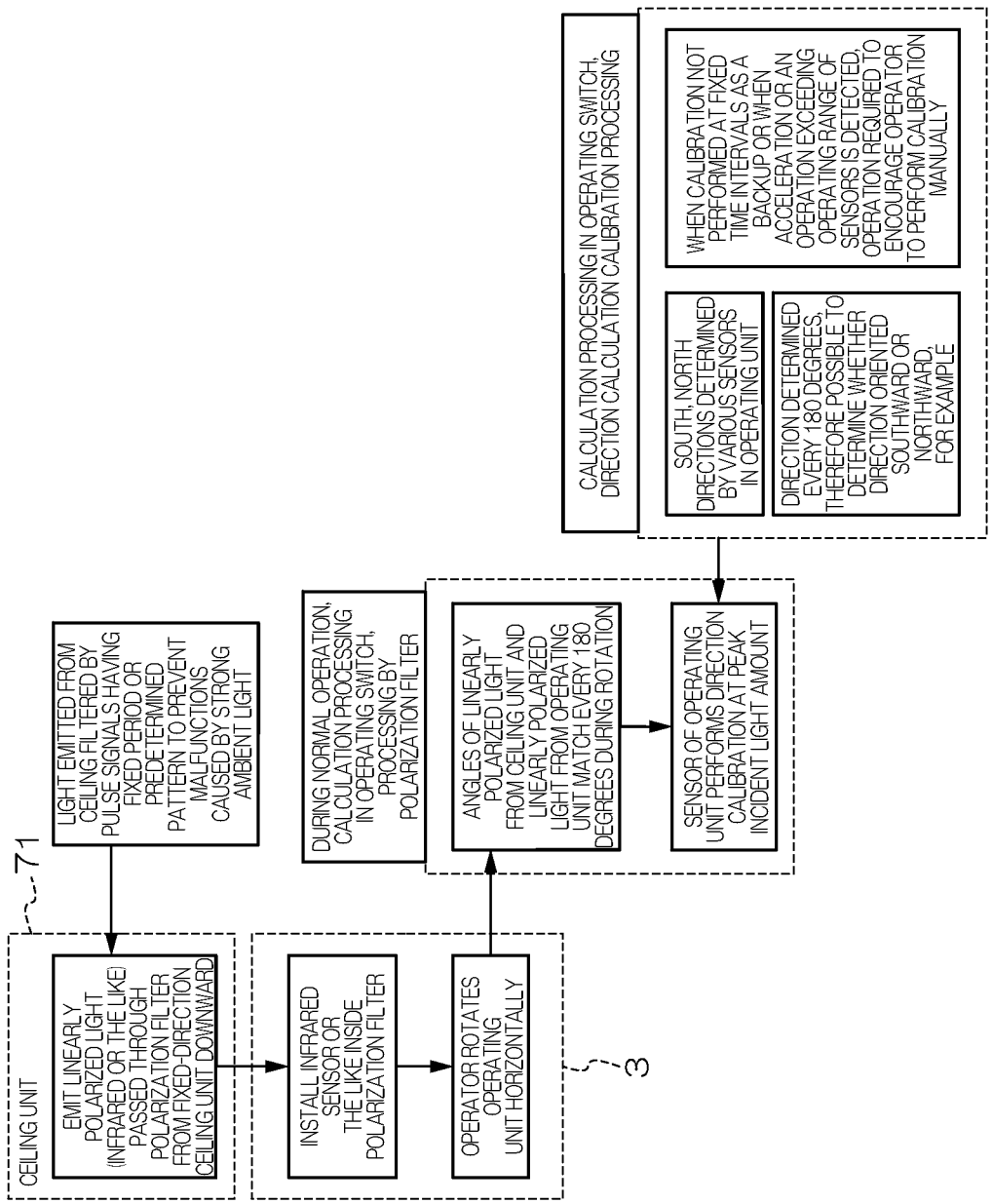

OPERATING DEVICE AND MOVING APPARATUS INCLUDING OPERATING DEVICE

This application is a national phase entry under 35 U.S.C. §371 of PCT Patent Application No. PCT/JP2011/003787, filed on Jul. 1, 2011, which claims priority under 35 U.S.C. §119 to PCT Patent Application No. PCT/JP2010/004369, filed on Jul. 2, 2010, and Japanese Patent Application No. 2011-093474, filed Mar. 31, 2011, all of which are incorporated by reference.

TECHNICAL FIELD

The present invention relates to an operating device capable of issuing an instruction to operate a driving device that drives movement of an object and manipulating a movement direction (including a movement azimuth, bearing, and so on; likewise hereafter with respect to the present invention and the present specification) of the object, and relates to a moving apparatus that includes the operating device.

BACKGROUND ART

An operating device capable of issuing an instruction to operate a driving device that drives movement of an object and manipulating a movement direction of the object when an operator modifies a relative rotation amount between a casing of a first device element and a casing of a second device element, and a moving apparatus including this operating device, are available in the prior art (Patent Documents 1 and 2).

CITATION LIST

Patent Literature

Patent Document 1: Japanese Patent Application Publication No. 2007-39232
Patent Document 2: WO 2008/099611 A1

SUMMARY OF INVENTION

Technical Problem

In the conventional operating device described above, however, a gap exists between the casing of the first device element and the casing of the second device element. When this gap exists, dust and water are more likely to enter through the gap and have an adverse effect on an electronic substrate and electronic components provided in the casing.

Further, when the operator holds the conventional operating device described above in the hand, the casing of the first (or second) device element and the casing of the second (or first) device element are normally disposed on an upper side and a lower side, respectively, and therefore a weight balance of the operating device, disposal positions of operating buttons, and so on must be designed comprehensively from the viewpoint of user-friendliness for the operator. Furthermore, when components are allocated to the respective casings while taking into account the weight balance, ease of assembly is likely to be impaired.

The present invention has been designed in consideration of the problems described above, and a first object thereof is to provide an operating device exhibiting superior sealing properties (dust resistance and water resistance, for example). Another object is to provide an operating device having few design restrictions and a small assembly operation load, and a moving apparatus including the operating device.

Solution to Problem

The present invention is an operating device including a detection unit for detecting input relating to an instruction to operate a driving device that drives movement of an object, and a casing, wherein a plurality of the detection units are arranged over a partial or entire range of a circumference of the casing in accordance with movement directions of the object.

The operating device preferably includes a jacket member that covers the detection units.

The jacket member is preferably capable of rotating around the circumference of the casing at least within the range in which the detection units are arranged.

An input unit for inputting the input is preferably provided on the jacket member.

The operating device preferably includes a small adjustment input detection unit for detecting input relating to an instruction to correct the movement direction of the object.

The casing preferably includes: an interior casing having a surface on which the detection units are provided; and an exterior casing that accommodates the interior casing, is formed to be free to rotate relative to the interior casing on an outer side thereof, and has an inner surface on which a reference member that serves as ON means relative to the detection units on the interior casing is provided.

According to the constitutions described above, the interior casing is housed inside the exterior casing, and therefore the operator can modify the movement direction simply by rotating the exterior casing such that the exterior casing is rotationally displaced relative to the interior casing on the inside thereof. Hence, the movement direction of the object can be modified by the operator through a sensory operation without the need to check a precise bearing, such as east, west, south, or north, and therefore modification of the movement direction can be learned easily. Moreover, although two casings are provided, the two casings are not connected in a length direction or a longitudinal direction, and therefore an operating device exhibiting a superior weight balance can be provided.

Furthermore, the movement direction can be modified by detecting the relative rotational displacement between the respective casings on the outside and the inside, thereby eliminating the need to install a complicated, expensive, and weighty component such as a rotary encoder.

Moreover, electric and electronic components housed in the interior casing are covered by a double-layer casing, leading to great improvements in water resistance and dust resistance.

An illuminating device for forming a light spot is preferably disposed in a location exposed to the exterior of the casing on a surface that corresponds to an opposite side to an operator, as a notification unit for providing notification of a travel direction of a traveling body that is moved by the driving device.

According to this constitution, the operator is notified anew of the direction in which the traveling body is heading by the light spot during an operation. Therefore, the operator can perform an operation safely and reliably while checking the content of the notification. Furthermore, the operator can keep an eye on a moving direction destination of the traveling body or the object moved by the traveling body and peripheral people (people around the operator), and therefore accidents can be forestalled. Moreover, the people around the operator can learn the direction in which the traveling body is heading, or in other words the direction of the moved object, from the notification provided by the notification unit without checking a display on a display unit, and can therefore detect danger to themselves caused by the approach of the traveling body or the object early.

Further, since a light spot is used as the notification means, the movement direction of the traveling body or the object moved by the traveling body, instructed by the operator using the operating device, is illuminated by light emitted from the operating device. As a result, the operator and the people around the operator can recognize the movement direction visually or intuitively.

A display unit for displaying, in a visually comprehensible manner, information relating to a displacement amount when an orientation of the object moved by the driving device is modified or information relating to an advancement direction of the object is preferably fixed to a traveling body that travels together with the object, in at least a region excluding an outer surface of the casing.

According to this constitution, the display unit is disposed in a high position within an operating space, and therefore a field of vision of the operator and/or the people around the operator viewing the display unit is not blocked by the object moving through the operating space, objects disposed in the operating space, and so on. As a result, the operator can perform operations quickly, reliably, and safely. More specifically, the display unit is disposed on the traveling body traveling along a Y direction rail, and therefore the operator and/or the people around the operator can grasp or predict the movement direction of the object and the behavior of the driving device from the display unit moving together with the traveling body. Hence, the operator and/or the people around the operator can understand a positional relationship between themselves and the moving object and obtain a sense of distance intuitively and easily.

The present invention is a moving apparatus including a driving device that drives movement of an object and an operating device that issues an instruction to operate the driving device, wherein the operating device is the operating device according to any of first to eighth aspects.

Advantageous Effect of Invention

According to a preferred aspect of the present invention, the plurality of detection units for detecting input relating to an instruction to operate the driving device that drives movement of the object are arranged over a partial or entire range of the circumference of the casing in accordance with the movement directions of the object, and therefore, when an instruction relating to the movement direction of the object is issued, it is sufficient for the detection unit corresponding to that movement direction to detect the input relating to the instruction. Hence, according to the first aspect, the operating device does not have to be constituted by two casings capable of relative rotation, as in the prior art, and therefore a gap is not formed between the two casings. As a result, an operating device that exhibits superior dust resistance and water resistance, and in particular an operating device having a simplified structure, can be realized.

According to a preferred aspect of the present invention, the jacket member that covers the periphery of the plurality of detection units arranged over a partial or entire range of the circumference of the casing of the operating device is provided, and therefore an operating device that exhibits even more superior dust resistance and water resistance can be realized (second aspect). In this case, at least the part of the jacket member covering the plurality of detection units may be constituted by a material that is soft enough to deform under digital pressure from the operator so that the operator can perform an operation easily. Further, by attaching button members to the jacket member, the operator can input an instruction (an instruction to operate the driving device that drives movement of the object) on each of the plurality of detection units by pressing the button members from the exterior of the jacket member toward the casing.

Note that the button member is a typical example of the input unit for inputting input relating to the instruction to operate the driving device that drives movement of the object (fourth aspect).

By making the jacket member capable of rotating around the circumference of the casing at least within the range in which the detection units are arranged, the need to dispose the aforesaid part to be constituted by a soft material or the aforesaid button members around or on all of the plurality of detection units arranged around the casing is eliminated, and therefore the number of parts to be constituted by a soft material or button members can be reduced (third aspect).

Further, by attaching the jacket member rotatably around a part or all of the circumference of the casing, the casing and the jacket member can be used respectively as casings of first and second (or second and first) device elements provided in a conventional operating device. In this case, however, only a few or substantially no electronic components need to be attached to the jacket member, and therefore increases in structural complexity and component number (depending on the application) relative to a conventional operating device do not occur. Hence, only a casing main body around which the jacket member is wrapped need be designed specially, enabling a reduction in an assembly load (third aspect).

Note that in a case where the jacket member is attached rotatably to the circumference of the casing such that the casing and the jacket member are used respectively as the casings of the first and second (or second and first) device elements provided in a conventional operating device, a gap formed between the jacket member and the casing causes problems. With this constitution, however, a gap of this type is not formed, and therefore improved dust resistance or water resistance can be realized in comparison with a conventional device (described below).

According to another preferred aspect of the present invention, the small adjustment input detection unit for detecting input relating to an instruction to correct the movement direction of the object is provided, and therefore a more precise instruction can be issued in relation to the movement direction of the object. More specifically, by setting the movement direction of the object roughly by having the operator input an instruction (an instruction to operate the driving device that drives movement of the object) into the plurality of detection units arranged around the circumference of the casing of the operating device and then making a small adjustment, more accurate positioning can be performed (fifth aspect). This is advantageous in a case where each of the plurality of detection units arranged around all or a part of the circumference of the casing of the operating device is large, meaning that a larger number of detection units cannot be disposed and that the movement direction of the object cannot therefore be set finely.

According to a ninth aspect of the present invention, a moving apparatus including the operating device having the features described above can be realized. A conveyance apparatus such as a crane serves as a representative example of the moving apparatus according to the present invention, but the moving apparatus according to the present invention is not limited to either a crane or other conveyance apparatuses.

Note that in the present invention, the "detection unit" denotes a mechanism or means (a sensor, an element, a switch, and so on) having a function for detecting input relating to an instruction to operate the driving device that drives movement of the object, and as long as the mechanism or means exhibits this function, any system or type (for example, a contact system, a non-contact system, an electromagnetic induction system, an electrostatic capacitance system, a waterproof type, a dustproof type, and so on) and any disposal method (for example, vertical disposal, horizontal disposal, diagonal disposal, zigzag disposal, mosaic form disposal, a mixture thereof, a method of arranging two or more mechanisms or means within a fixed range or covering the fixed range with the mechanisms or means, and so on) may be employed as the "detection unit".

In the present invention, the "input unit" denotes a member, a component, or the like having a function for inputting input relating to the instruction to operate the driving device that drives movement of the object, and as described above, a button member such as a push button, a panel surface of a touch panel, and so on serves as a representative example thereof. In certain cases, an operating switch on which the operator issues an instruction to operate the driving device that drives movement of the object using the operating device may be formed by a combination of the detection unit and the input unit. Depending on the application of the present invention, an operating switch of this type is also included in the "detection unit".

Further, in the following description, a collection of a plurality, or two or more, detection units may be referred to as a "detection unit group" to differentiate the collection from a single detection unit. However, the "detection unit group" need not appear outwardly to include a plurality of detection units, and even when, at first glance, only a single detection unit appears to be present, as long as this single detection unit (for example, a detection unit in which a plurality of pressure sensitive elements are surface-distributed, a detection unit formed by arranging a plurality of detection units of this type, where the detection unit serves as a single unit, and so on) exhibits substantially equivalent functions to a collection of a plurality of detection units, the single detection unit corresponds to the "detection unit group".

BRIEF DESCRIPTION OF THE DRAWINGS

FIG. 13 is a sectional view showing a basic constitution of another ring shaped detection unit provided in the operating device according to the present invention;

FIG. 14 is a sectional view showing a basic constitution of another ring shaped detection unit provided in the operating device according to the present invention;

FIG. 16 is a side view showing an example of a display unit of the moving apparatus shown in FIG. 1;

FIG. 17 is a front view showing an example of the display unit of the moving apparatus shown in FIG. 1;

FIG. 18 is a block diagram showing another schematic constitutional example of a reference position adjustment mechanism of the operating device used in the overhead crane serving as the moving apparatus according to this embodiment of the present invention;

FIG. 19 is a pattern diagram showing the constitution of the reference position adjustment mechanism shown in FIG. 16;

FIG. 20 is a time chart schematically illustrating a reference position adjustment method employed by the reference position adjustment mechanism shown in FIG. 16; and FIG. 21 is a flowchart illustrating processing of respective constituent units during execution of the reference position adjustment method employed by the reference position adjustment mechanism shown in FIG. 16.

DESCRIPTION OF EMBODIMENTS

First Embodiment

Figure 1:
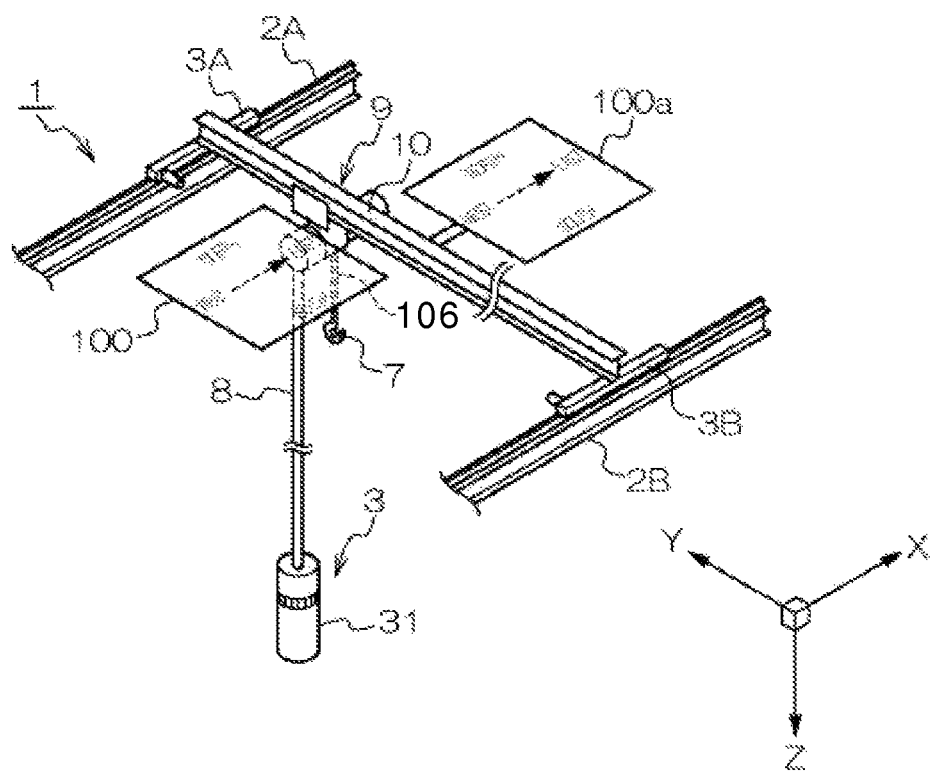
FIG. 1 is a perspective view showing an overall constitution of an overhead crane serving as a moving apparatus according to an embodiment of the present invention.

Preferred embodiments of the present invention will be described in detail below with reference to the attached drawings. In the following description, the drawings will be referred to as necessary, but identical reference numerals will be allocated to identical, corresponding, or shared parts in the drawings and description thereof will be partially omitted. Note that the embodiments to be described below are preferred specific examples of the present invention, and although various preferred technical limitations are applied thereto, the scope of the present invention is not limited to these embodiments unless specific description limiting the present invention is provided.

Figure 2:
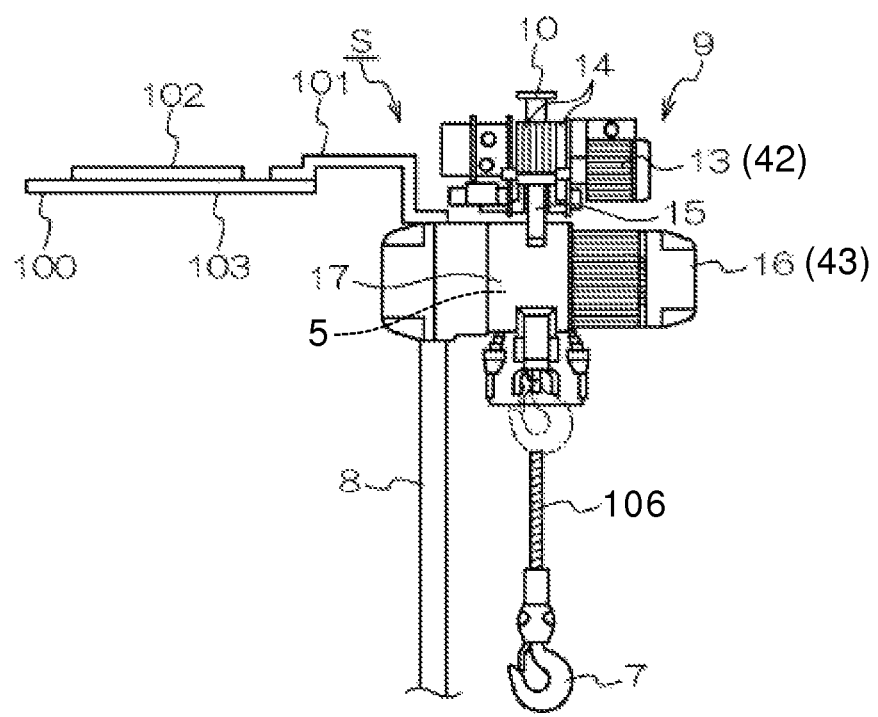
FIG. 2 is a view showing a structure of a hoist serving as an elevator of the overhead crane serving as the moving apparatus according to this embodiment of the present invention.

FIG. 1 is a perspective view showing an overall constitution of an overhead crane serving as a moving apparatus according to an embodiment of the present invention, and FIG. 2 is a view showing a structure of a hoist serving as an elevator of the overhead crane serving as the moving apparatus according to this embodiment of the present invention.

As shown in FIG. 1, an overhead crane 1 serving as the moving apparatus according to this embodiment includes travel rails 2A, 2B constituted by at least a pair of X direction rails disposed parallel to an X direction at a predetermined interval close to a ceiling of a building. A pair of saddles 3A, 3B are provided in contact with the respective X direction rails 2A, 2B via wheels so as to travel in the X direction. A crane girder 10 serving as a Y direction rail disposed in a Y direction perpendicular to the X direction is provided between the saddles 3A, 3B. A traveling body 9 that moves along the crane girder 10 in the Y direction and includes a hoist for lifting and lowering a package or the like in a Z direction perpendicular to both the X and Y directions is also provided.

More specifically, the traveling body 9 is a mobile elevator formed by fixing a hook 7 serving as a moving body to a tip end of a supporting wire rope 106 wound onto the traveling body 9.

More specifically, the traveling body 9 is a mobile elevator formed by fixing a hook 7 serving as a moving body to a tip end of a supporting wire rope 6 wound onto the traveling body 9.

Hence, the overhead crane 1 is formed by laying the crane girder 10 laterally substantially perpendicular to the travel rails 2A, 2B so that the traveling body 9 having the hook 7 on its tip end moves along the crane girder 10. Therefore, the overhead crane 1 is suitable for use as the moving apparatus according to the present invention, which centers on a three-dimensional moving mechanism including a Z axis motor for moving the hook 7 serving as the moving body in an up-down direction, and an X axis motor and a Y axis motor for moving the hook 7 in a horizontal plane.

A flexible but not twistable communication cable 8 serving as an elongated member hangs down from the traveling body 9 to the vicinity of a floor surface, and a lower end of the communication cable 8 is connected to an operating device 3 having a casing 31 (described below) that does not displace rotationally relative to the communication cable 8.

Here, the flexible but not twistable communication cable 8 is formed by building a communication line into a flexible but not twistable cable tube and electrically connecting the resulting component to the operating device 3. More specifically, a metal flexible conduit and a resin-covered metal flexible conduit prescribed by JIS-C8309, for example, may be used as the "flexible but not twistable cable tube". A Plicatube (product name) or a Waterproof Plicatube (product name), manufactured by Sankei Manufacturing Co., Ltd., for example, may be used.

As shown in FIG. 2, the traveling body 9 includes a pair of wheels 14 provided so as to sandwich the crane girder 10 such that when the wheels 14 are driven to rotate by a traversing motor 13 (the Y axis motor 42), the traveling body 9 performs a traversing motion along the crane girder 10. A hoist main body 17 is supported by a support member 15 so as to hang down from the traversing unit, and a hoisting motor 16 (the Z axis motor 43) for hoisting or uncoiling the supporting wire rope 106 is attached to the hoist main body 17.

A travel wheel and a travel motor (the X axis motor 41), not shown in the drawings, are provided on each of the saddles 3A, 3B that travel over the travel rails 2A, 2B while supporting either end of the crane girder 10 shown in FIG. 1. Further, a motor driving control circuit 5 for driving the X axis motor 41, a Y axis motor 42, and a Z axis motor 43 in accordance with an operation of the operating device 3 is built into the hoist main body 17 shown in FIG. 2. The motor driving control circuit 5 will be described in detail below.

In this embodiment, a display unit for displaying an orientation of the operating device 3 or an advancement direction of the aforementioned object is provided in a location within a field of vision of an operator, i.e. in a region excluding respective surfaces of the casing 31 of the operating device 3.

In FIGS. 1 and 2, a display unit 100 is constituted by a direction displaying device and illustrated as a planar display panel. As will be described below, however, the display unit may take other forms in order to secure a wider viewing range. The display unit 110 displays a direction in which the traveling body 9 travels in response to a command from the operating device 3 in characters or symbols of as large a size as possible to enable viewing by people in a wide range. Light, sound, different colors in the case of color display, alphabetic characters, and so on may be selected appropriately as a method employed by the display unit 100 to provide notification of the direction.

The display unit 100 is preferably disposed on the ceiling or in another high location to enable viewing from a wide range. When applied to an overhead crane, for example, the display unit 100 may be disposed in an appropriate location of the crane girder 10 where collisions with the traveling body 9 do not occur. If disposed on the crane girder 10, the display unit 100 is preferably disposed on the crane girder 10 in the vicinity of a central portion in a lengthwise direction of the crane girder 10 (as long as collisions with the traveling body 9 do not occur in that location). The crane girder 10 serves as a movement path of the traveling body 9, and therefore, by disposing the display unit 100 on the crane girder 10, the operator paying attention to the movement of the traveling body 9 and people around the operator can view the display unit 100 easily and grasp the location of the traveling body 9 quickly even if the traveling body 9 momentarily disappears from sight.

In this embodiment, as is evident from FIG. 2, a stay 101 is fixed to an upper surface of the hoist main body 17 forming the traveling body 9, and the display unit 100 is attached to the stay 101 such that a display surface 103 thereof is oriented downward. Note that a reference numeral 102 denotes a driving circuit of the display unit 100.

When the display unit 100 is applied to an overhead crane disposed in a large facility, the display unit 100 is preferably disposed on the traveling body 9, or in other words the crane girder 10, and more preferably fixed to the vicinity of the lengthwise direction center of the crane girder 4. It is dangerous to follow the display unit 100 moving together with the traveling body 9 through the large facility continuously with the eyes, and therefore, by fixing the display unit 100 in a fixed position, this danger is reduced.

Note that the display unit 100 may be provided singly or in a plurality. For example, another display unit 100a may be provided in a management office, not shown in the drawings, located away from the overhead crane. Thus, a facility manager can also grasp current crane movement, which is convenient for management purposes.

Further, the plurality of display units 100 may be disposed in locations other than the management office and the outer surface of the operating device 3, such as a factory ceiling, a factory column, a factory wall surface, and so on, i.e. any location enabling viewing by people around the operator.

Furthermore, a display content of the display unit is not limited to shapes and colors, and instead, or additionally, a guide unit that provides notification of the traveling direction of the traveling body 9 on the crane using sound may be provided so that the operator and the people around the operator can be provided with this information aurally.

A constitutional example of the display unit 100 will be described in detail below.

Figure 3:
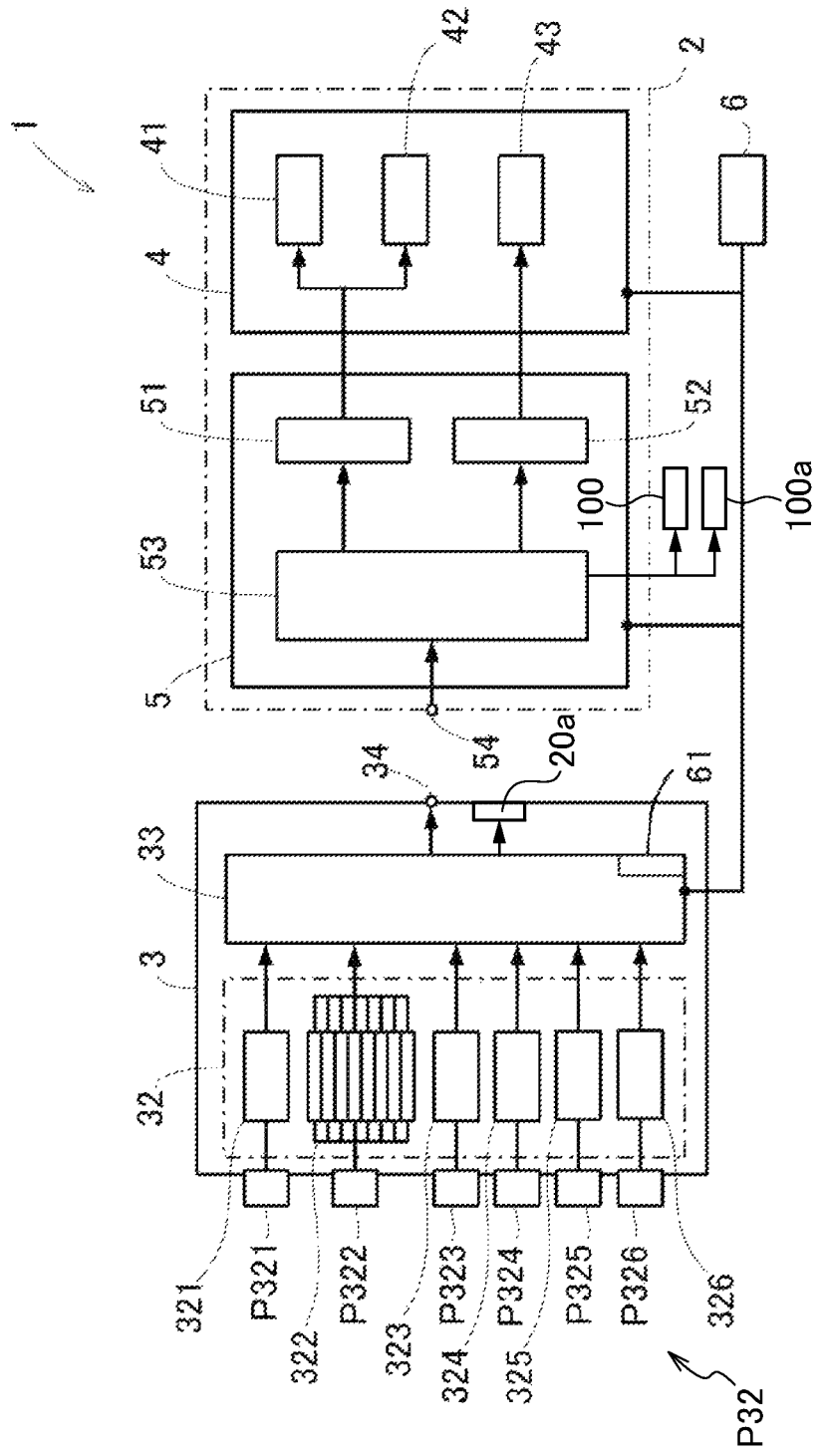
FIG. 3 is a block diagram showing constitutions of main parts and an electric configuration of a moving apparatus according to a first embodiment of the present invention.

FIG. 3 is a block diagram showing constitutions of main parts and an electric configuration of a moving apparatus according to a first embodiment of the present invention.

[Constitutions of Main Parts]

As shown in the drawing, a moving apparatus 1 includes a driving device 2 and the operating device 3 for operating the driving device 2. The driving device 2 includes a driving motor 4 and a motor driving control device 5 for controlling the driving motor 4. The driving motor 4 includes an X axis motor 41, a Y axis motor 42, and a Z axis motor 43, and thereby serves as a driving force source for moving the object three-dimensionally. The motor driving control device 5 includes an inverter or a contactor 51 for issuing drive signals to the X axis motor 41 and the Y axis motor 42, an inverter or a contactor 52 for issuing a drive signal to the Z axis motor 43, and a microcomputer 53 for controlling the inverter or contactor 51 and the inverter or contactor 52. The microcomputer 53 includes an input end portion 54 to which an operation signal from the operating device 3 is transmitted.

A power supply 6 supplies power required to operate the operating device 3, the driving motor 4 (the X axis motor 41, Y axis motor 42, and Z axis motor 43), the motor driving control device 5, and so on. In FIG. 3, the power supply 6 is disposed on an exterior of the casing 31 of the operating device 3, but all or a part of the power required to operate the operating device 3 may be supplied from an internal power supply 61, represented by a battery, provided inside the casing 31.

The display units 100, 100*a* described with reference to FIG. 1 are connected to the microcomputer 53. The constitution and functions of the display units 100, 100*a* will be described in detail below.

The operating device 3 includes the casing 31, which can be held in the hand of the operator operating the moving object, and the casing 31 includes an input unit operated by the operator, a detection unit 32 that detects an instruction (also referred to hereafter as "operation input") to operate the driving device 2, which is issued by the operator via the input unit, a microcomputer 33 that processes a signal from the detection unit 32 and generates an operation signal, and an output end portion 34 that outputs the operation signal to the input end portion 54.

There are no particular limitations on a control system employed by the microcomputer 53 to control the inverter or contactor 51, and an analog system, a multispeed system, or another system may be used. Further, there are no particular limitations on a communication system employed between the microcomputer 33 and the microcomputer 53. There are also no particular limitations on a signal transmission system employed between the output end portion 34 and the input end portion 54, and either a wireless system or a wired system may be used. When a wired system is employed, a communication cable is provided between the output end portion 34 and the input end portion 54 to connect the two end portions, and when a wireless system is employed, the respective end portions include transmitting means and receiving means forming a pair therewith.

Further, the operating device 3 preferably includes an illuminating unit 20*a* as notifying means. More specifically, the microcomputer 53 is connected to the illuminating unit 20 in order to indicate the direction of an advancement path of the traveling body 9. The illuminating unit 20*a* will be described in detail below.

[Detection Unit and Input Unit]

The detection unit 32 includes (1) an elevator input detection unit 321 (a hoisting input detection unit 321*a* and a lowering input detection unit 321*b*) for detecting operation input relating to an elevation movement of the object, (2) a detection unit group 322 constituted by a plurality of detection units arranged around all or a part of a circumference of the casing 31, wherein individual detection units 322*a*, 322*b*, 322*c*, ... are associated in advance with movement directions of the object, (3) one or more detection units 323 for detecting operation input relating to activation, reactivation, stopping, resetting, and so on of the driving device 2, operating device 3, power supply 6, and so on (including a detection unit 323*a* for detecting operation input relating to an emergency stop, a detection unit 323*b* for detecting operation input relating to resetting, and a detection unit 323*c* for detecting operation input relating to power supply ON/OFF; also referred to hereafter either individually or collectively as an "activation-related input detection unit"), (4) a detection unit 324 for detecting operation input for making small adjustment or corrections to the movement direction of the object (including a detection unit 324*a* relating to small adjustments in a predetermined direction and a detection unit 324*b* relating to small adjustments in an opposite direction; also referred to hereafter either individually or collectively as a "small adjustment input detection unit"), (5) a detection unit 325 for detecting operation input relating to special functions (also referred to as a "special input detection unit" hereafter), and (6) a driving start detection unit 326 for detecting operation input relating to a driving instruction required to drive the driving device 2 to move the object in a direction associated with an arbitrary detection unit 322*x* of the detection unit group 322.

The detection unit group 322 is arranged in the shape of a closed ring surrounding the entire circumference of the casing 31. However, the detection unit group 322 may be arranged as a whole in an arc shape or an unclosed or open ring shape about a part of the circumference of the casing 31 as long as it functions to detect the object movement direction selected by the operator. Hereafter, the plurality of detection units (including but not limited to the detection unit group 322) arranged to surround all or a part of the circumference of the casing 31 will also be referred to as a "ring shaped detection unit".

The small adjustment input detection unit 324 and the special input detection unit 325 are provided as required.

The small adjustment input detection unit 324 and the driving start detection unit 326 are both provided as detection units for detecting operation input relating to the driving device 2. The special input detection unit 325 may be provided both as a detection unit for detecting operation input relating to the driving device 2 and for other purposes.

The driving device 2 normally does not drive the object to move in the direction corresponding to the detection unit 322*x* of the detection unit group 322 as soon as the detection unit 322*x* detects operation input, but rather waits until the driving start detection unit 326 detects operation input thereafter.

Note that the operating device 3 and the driving device 2 may be designed to drive the object as soon as the detection unit 322*x* of the detection unit group 322 detects operation input. In this case, the driving start detection unit 326 and an input unit P326 thereof are not required.

An input unit P32 is constituted by input units P321 (P321*a*, P321*b*), P322 (P322*a*, P322*b*, P322*c*, ... ), P323 (P323*a*, P323*b*), P324 (P324*a*, P324*b*), P325, and P326 (none of which are shown in the drawings) for inputting operation input into the respective detection units 32.

A push button may be cited as a representative example of the input unit P32, but any mechanism or means for generating operation input and enabling the operation input to be detected by a constituent element, a sensor, or the like of the detection unit 32 is sufficient. Thus, a case in which operation input is generated by relatively rotating two casings, as in a conventional operating device, is not excluded from the input unit P32 (in this case, the two relatively rotated casings themselves may be considered to correspond to the input unit).

When the small adjustment input detection unit 324 is not provided, the input unit 324 of the small adjustment input detection unit 324 is not required. Similarly, when the special input detection unit 325 is not provided, the input unit P325 of the special input detection unit 325 is not required.

[Electric Configuration]

The elevator input detection unit 321 and the input unit P321 thereof are associated with an operation for driving the Z axis motor 43. For example, when the operator operates the input unit P321 such that operation input corresponding to the operation is detected by the elevator input detection unit 321, the elevator input detection unit 321 generates a signal corresponding to the operation input. This signal is transmitted to the microcomputer 33. The microcomputer 33 performs required processing on the signal to generate an operation signal based on the signal. The operation signal is transmitted from the output end portion 34 to the input end portion 54 and from the input end portion 54 to the microcomputer 53. The microcomputer 53 generates a control signal on the basis of the operation signal, and transmits the control signal to the inverter or contactor 52. The inverter or contactor 52 controls an operation of the Z axis motor 43.

Note that when the small adjustment input detection unit 324 and the input unit P324 thereof are constituted by a detection unit and a corresponding input unit for making small adjustments or corrections to movement of the object in the up-down direction, the small adjustment input detection unit 324 and the input unit P324 thereof are associated with an operation for driving the Z axis motor 43, similarly to the example described above. A case in which an up-down direction small adjustment input detection unit and a corresponding input unit for making small adjustments or corrections to movement of the object in the up-down direction are provided as the special input detection unit 325 and the input unit P325 thereof is similar, and in this case also, the up-down direction small adjustment input detection unit and the input unit thereof are associated with an operation for driving the Z axis motor 43, similarly to the example described above.

In FIG. 3, the detection unit group 322 and the input unit P322 thereof, and also the driving start detection unit 326 and the input unit P326 thereof, are associated with operations for driving the X axis motor 41 and the Y axis motor 42, respectively. For example, (1) when the operator operates the input unit P322 such that operation input corresponding to the operation is detected by any detection unit 322x of the detection unit group 322, the detection unit 322x generates a signal relating to the object movement direction pre-associated with the detection unit 322x itself. This signal is transmitted to the microcomputer 33. The microcomputer 33 performs required processing on the signal to generate an operation signal based on the signal. Further, (2) when the operator operates the input unit P326 after operating the input unit P322 such that operation input corresponding to the operation is detected by the driving start detection unit 326, the driving start detection unit 326 generates a signal corresponding to the operation input. This signal is transmitted to the microcomputer 33. The microcomputer 33 performs required processing on the signal to generate an operation signal based on the signal. (3) These operation signals are both transmitted from the output end portion 34 to the input end portion 54 and from the input end portion 54 to the microcomputer 53. The microcomputer 53 generates control signals on the basis of the operation signals, whereupon the inverter or contactor 51 controls an operation of the X axis motor 41 and the Y axis motor 42 on the basis of the respective control signals.

Note that likewise in a case where the small adjustment input detection unit 324 and the input unit P324 thereof are constituted by a detection unit and a corresponding input unit for making small adjustments or corrections to the movement direction of the object on a horizontal plane, the small adjustment input detection unit 324 and the input unit P324 thereof are associated with an operation for driving the X axis motor 41 and the Y axis motor 42, similarly to the example described above.

Further, the display units 100, 70a described with reference to FIG. 1 are connected to the microcomputer 53. The display unit will be described in detail below.

[Summary]

Using the operating device 1 of the moving apparatus 1, the operator can manipulate movement of the object in a Z axis direction, an X axis direction, a Y axis direction, or a direction synthesized from the X axis direction and the Y axis direction by operating the input units.

Therefore, using the operating device 1 of the moving apparatus 1, the operator can manipulate movement of the object within a three-dimensional space by operating the input units.

When the moving apparatus 1 is an overhead crane apparatus, for example, the overhead crane apparatus can be operated using the operating device 1. In this case, a motor that enables a hoisting operation (movement in the Z axis direction) of the overhead crane corresponds to the Z axis motor, while motors that enable a traversing operation (movement in the X axis direction), a traveling operation (movement in the Y axis direction), and a diagonal operation synthesized from the traversing and traveling operations along a horizontal wall surface of a building correspond to the X axis motor and the Y axis motor.

[Related Matter]

Figure 4:
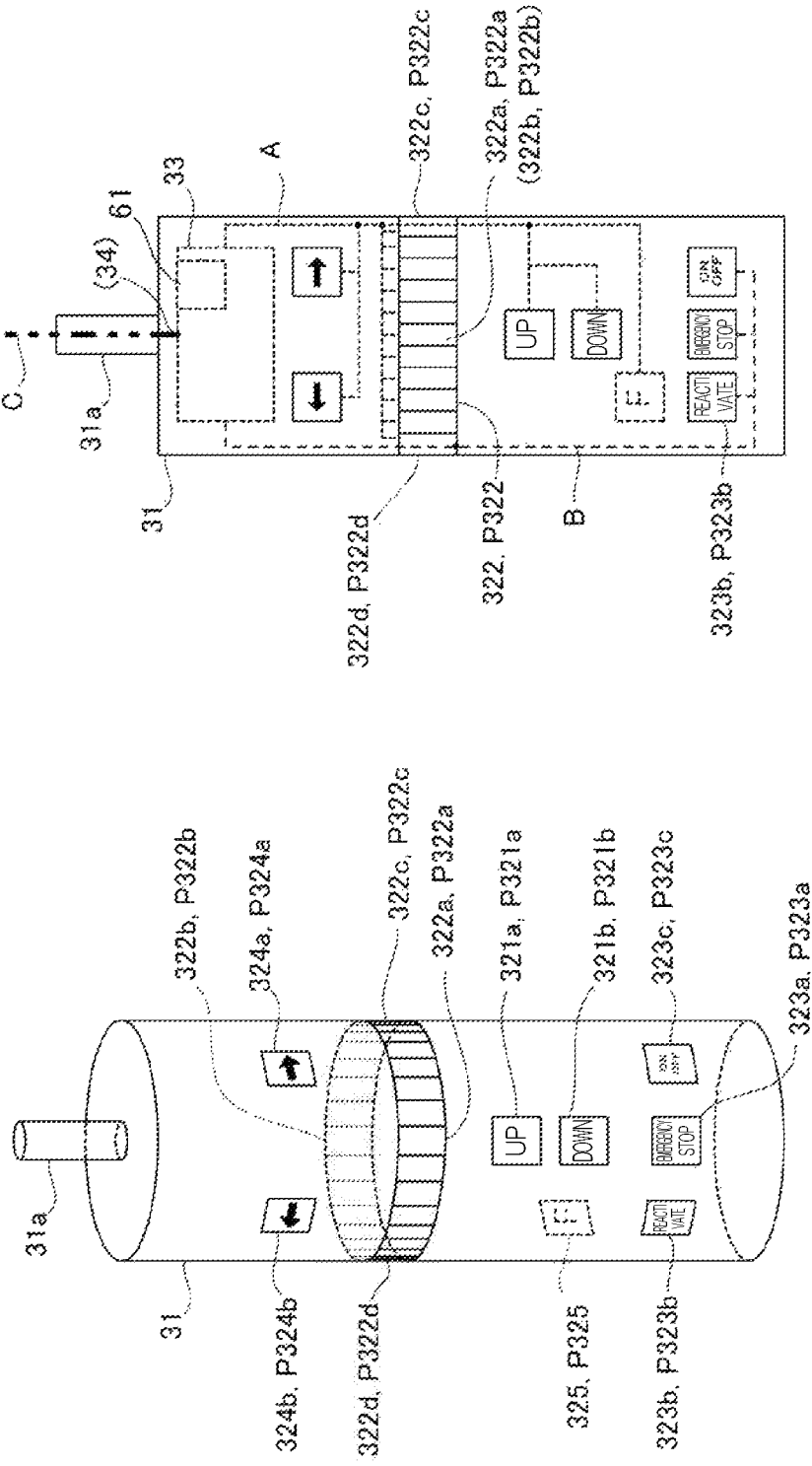
FIG. 4 is a view showing a constitution of an operating device according to a second embodiment of the present invention.

In FIGS. 2 and 4, associations between the detection unit group 322 (322a, 322b, 322c, . . . ) and corresponding input units P322 (P322a, P322b, P322c, . . . ) and the movement direction of the object are set such that when the detection unit group 322 is constituted by a total of N detection units and the detection units are arranged at equal distances about the entire circumference of the casing, for example, an object movement direction based on operation input relating to a detection unit 322m, from among arbitrary adjacent detection units 322m, 322n, deviates from an object movement direction based on operation input relating to the detection unit 322n by (360/N) degrees. In other words, the object movement direction cannot be set at a smaller angle than (360/N) degrees.

Meanwhile, the small adjustment input detection unit 324 and the input unit P324 (324a, 324b) thereof correct the object movement direction to enable the object to move in a direction that cannot easily be set by operation input relating to the adjacent detection units 322m, 322n. For example, a correction unit (U) is set by dividing (360/N) degrees into t units, whereupon an input frequency or an input time of operation input relating to the small adjustment input detection unit 324a for a forward direction (a clockwise direction, a rightward direction, or the like, for example) is set at a positive value and an input frequency or an input time of operation input relating to the small adjustment input detection unit 324b for a reverse direction (a counterclockwise direction, a leftward direction, or the like, for example) is set at a negative value. A total operation frequency or operation time (p) of the small adjustment input unit P324 (P324a, 324b) is then determined, whereupon (360/Nt) degrees is integrated in accordance with the value of p. A result thereof is added to a pre-correction direction (R0), and a result thereof is set as a post-correction movement direction (R0+U×p=R0+(360/Nt)×p). By performing the calculations and control illustrated in this example using the microcomputer 53, the inverter or contactor 51, the driving motors 41, 42, and so on, the object movement direction can be corrected.

Note that when the individual detection units are small (see FIG. 13), [a range of] (360/N) degrees also decreases. In this case, the small adjustment input detection unit 324 and the input unit P324 thereof are not required.

Second Embodiment

Referring to FIGS. 3 and 4, an operating device according to a second embodiment of the present invention will be described.

[Constitution of Main Parts]

As shown in FIGS. 3 and 4(*a*), the casing 31 of the operating device 3 includes the detection unit 32, or more specifically the elevator input detection unit 321, detection unit group 322, activation-related input detection unit 323, and small adjustment input detection unit 324, as well as the input units P32 (P321, P322, P324) thereof, and also includes a hollow projecting portion 31*a* on an upper portion thereof.

The respective detection units 32 and corresponding input units P32 may be disposed on the casing 31 as desired, but in the operating device shown in FIG. 4(*a*), the input unit P321 of the elevator input detection unit 321 is disposed on a front surface of the casing 31 so as to be in front of the operator when the operator holds the casing 31 in his/her hand, the input unit P324 of the small adjustment input detection unit 324 is disposed in the vicinity of the input units P322 of the detection unit group 322, and the input unit P323 of the activation-related input detection unit 323 is disposed on a casing lower portion (a lower portion of the front surface of the casing 31 located in front of the operator when the operator holds the casing 31 in his/her hand).

The input unit P32 of each detection unit 32 (including an input unit P322*x* of the arbitrary detection unit 322*x* of the detection unit group 322) is integrated with the corresponding detection unit 32 to form a single operating switch.

Each detection unit 32 may be constituted by a mechanical contact point enabling energization, a pressure sensitive element that detects pressure, a sensor that detects electrostatic capacitance or variation therein, a magnetic sensor that detects magnetism or the like, an optical sensor that detects light, and so on. Alternatively, each detection unit 32 may be constituted by a non-contact type sensor such as any so-called proximity sensor.

The individual detection units 322*x* constituting the detection unit group 322 double as the driving start detection unit 326. Accordingly, when the operator operates the input unit 322*x*, the resulting operation input serves simultaneously as both operation input for determining the movement direction of the object associated with the detection unit 322*x*, for example the traveling body 9 in FIGS. 1 and 2, and operation input for issuing an instruction to drive the driving device 2 in order to move the object in that direction.

The detection unit group 322 is arranged in a ring shape about the entire circumference of the casing 31. The individual detection units of the detection unit group 322 are set to correspond to respective object movement directions relative to the operator, and this setting can be modified by modifying a setting pattern of wire setting pins (not shown). For example, when the operator holds the casing 31 such that the input unit P321 of the elevator input detection unit 321 directly faces the operator, the detection unit 322*a* positioned in front of the operator can be used to select and set the next traveling direction of the traveling body 9, for example, and issue a corresponding instruction.

More specifically, [the respective detection units] can be selected and set [such that the detection unit 322*a*] corresponds to a direction heading from the casing 31 toward the operator (i.e. rearward from the operator), the detection unit 322*b* positioned on an opposite side to the detection unit 322*a* corresponds to a direction heading from the operator toward the casing 31 (i.e. forward from the operator), the detection unit 322*c* positioned between the detection units 322*a* and 322*b* on a right hand side of the operator corresponds to a rightward direction from the operator, and the detection unit 322*d* positioned between the detection units 322*a* and 322*b* on a left hand side of the operator (i.e. on an opposite side to the detection unit 322*c*) corresponds to a leftward direction from the operator.

Further, detection units positioned between the detection units 322*a* and 322*c*, between 322*c* and 322*b*, between 322*a* and 322*d*, and between 322*d* and 322*b* may be selected and operated. In so doing, [the detection units] can be set to correspond to directions belonging respectively to a region between the rearward and rightward directions of the operator, a region between the rightward and forward directions, a region between the forward and leftward directions, and a region between the leftward and forward directions.

Furthermore, the detection units 322*a* and 322*b* can be modified to correspond respectively to the front and the rear of the operator, while the detection units 322*c* and 322*d* can be modified to correspond respectively to the leftward direction and the rightward direction of the operator.

[Electric Configuration]

As shown in FIG. 4(*b*), the casing 31 includes, in its interior, the microcomputer 33 connected to wires A, B, C, the output end portion 34, and the respective detection units 32 connected to the wires A, B. The wire C is disposed in the hollow projecting portion 31*a* so as to connect the interior of the casing 31 to the outside.

The wires A, B, C include signal lines for transmitting signals and power lines for supplying power. Power required to operate the operating device 3 is supplied to the microcomputer 33 either from an external power supply through the wire C or from the internal power supply 61 represented by a battery, and distributed to the respective detection units 32 through the wires A, B.

When the operator operates the respective detection units 32, a signal relating to the operation input corresponding to the operation is transmitted to the microcomputer 33 through the wires A, B. The microcomputer 33 performs required processing on the signal to generate an operation signal based on the signal. The operation signal is transmitted from the output end portion 34 to the input end portion 54 through the wire C.

[Summary]

The operating device 3 employing the detection unit group 322 described above differs from a conventional operating device in that there is no need to prepare two casings, dispose the two casings one above the other, and rotationally operate the two casings relative to each other. Accordingly, a gap formed by a seam between the two casings does not exist, and therefore the operating device 3 exhibits superior sealing properties (dust resistance and water resistance, for example). Further, structural simplicity and a comparatively small number of components are realized, and therefore design restrictions and an assembly operation load can be reduced.

[Related Matter]

Note that when signal transmission between the output end portion 34 and the input end portion 54 is performed using a wired system, a contact point between the wire C and the microcomputer 33 may be considered equivalent to the output end portion 34, as shown in FIG. 4(*b*). When signal transmission is performed using a wireless system, however, the contact point does not have to serve as an output portion. In this case, the wire C is connected to the communication cable 8 described with reference to FIGS. 1 and 2 and inserted into the hollow projecting portion 31*a*. A specific example of a wireless system will be described below.

Further, when the power required to operate the operating device 3 is supplied from the internal power supply 61, the power supplied from the internal power supply is distributed to the respective detection units 32 through the wires A, B. In this case, the wire C serving as a supply line is not required, and therefore both the wire C and the hollow projecting portion 31*a* become unnecessary. However, the wire C and the hollow projecting portion 31*a* are required in a case where the wire C serves as a signal line for transmitting signals to the outside via the communication cable 8.

When the power required to operate the operating device 3 is supplied from the internal power supply and signal transmission with the outside is performed using a wireless system, the wire C and the hollow projecting portion 31*a* are not required. When the wire C and the hollow projecting portion 31*a* perform other roles (see the modified example described below), however, the wire C and the hollow projecting portion 31*a* remain necessary. When, for example, the transmitting means constituting the output end portion 34 require an antenna to perform signal transmission wirelessly, the antenna can be disposed in the interior of the hollow projecting portion 31*a*, and in this case, therefore, the hollow projecting portion 31*a* remains necessary.

Third Embodiment

Figure 5:
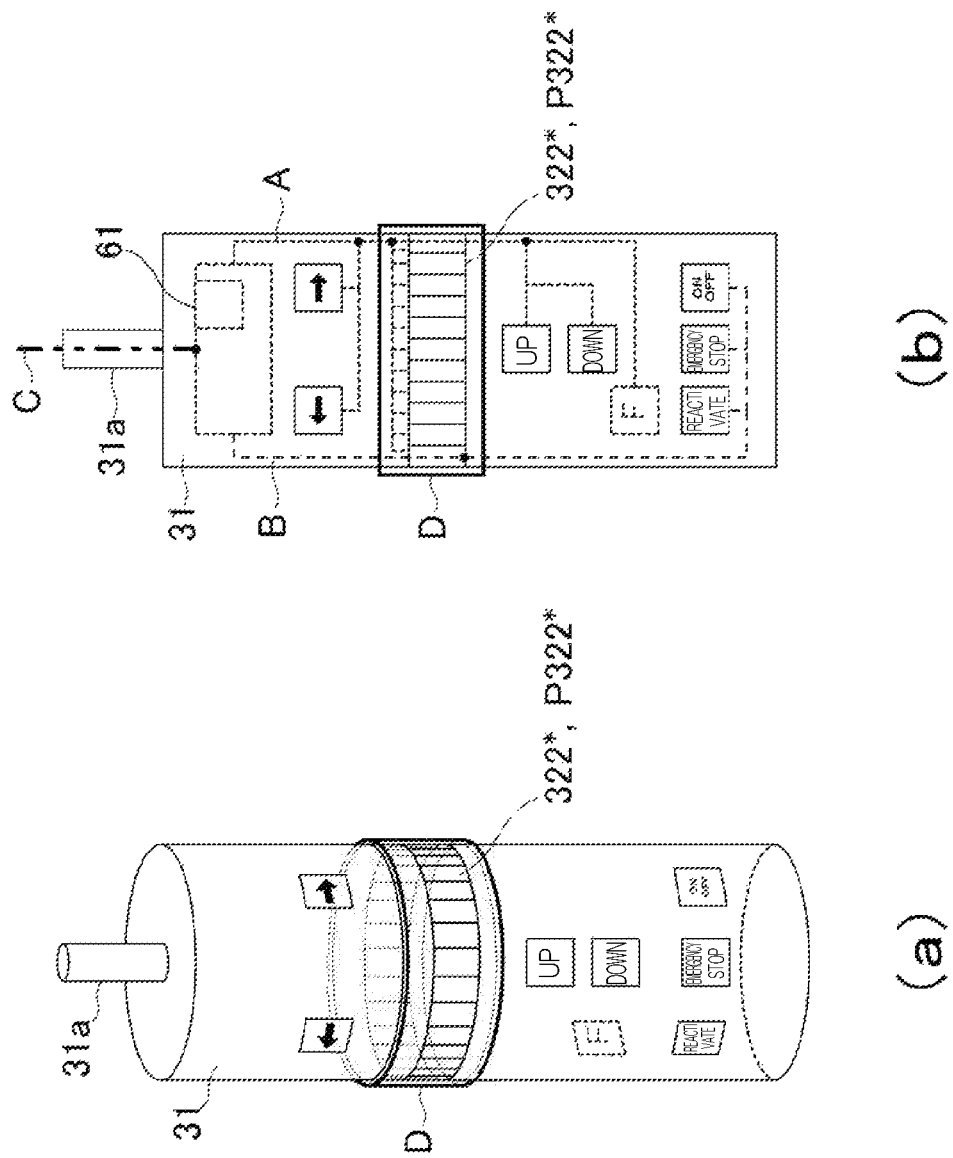
FIG. 5 is a view showing a constitution of an operating device according to a third embodiment of the present invention.

FIG. 5 is a view showing a constitution of an operating device according to a third embodiment of the present invention and a view showing a modified example of the operating device shown in FIG. 4. The operating device of FIG. 5 differs from the operating device of FIG. 4 in including a jacket member D covering a surface of the ring shaped detection unit 322.

As shown in FIG. 5, the jacket member D is a strip form member covering the surface of the ring shaped detection unit 322 (the individual detection units 322*a*, 322*b*, 322*c*, . . . constituting the detection unit group 322) and the input units P322 (P322*a*, P322*b*, P322*c*, . . . ) on the casing 31 and an outer surface of the casing 31 in the vicinity thereof. As is evident from the drawing, the jacket member D serves as a cover member for covering the ring shaped detection unit 322. At least a part of the jacket member D corresponding to the input unit P322 of the ring shaped detection unit 322 is formed from a synthetic resin that is flexible enough for the operator to operate the input unit P322 easily or provided with through holes into which the operator can insert a finger. When synthetic resin is used for this part, the synthetic resin is preferably transparent or translucent.

The jacket member D may be fixed so as not to move relative to the outer surface of the ring shaped detection unit 322 and the casing 31, or may be unfixed. For example, the jacket member D may be disposed to be capable of rotating 360 degrees, or in a larger or smaller angle range than 360 degrees, around the circumference of the casing 31.

The input unit P322 is interposed between the jacket member D and the outer surface of the ring shaped detection unit 322, and a reference member J, a protective sheet S, and so on may be interposed between the input unit P322 and the jacket member D.

Although not shown in FIG. 5, the reference member J and the protective sheet S are constituted substantially identically to those of FIGS. 7 and 11, which are specific examples of other embodiments to be described below.

The reference member J functions to switch mechanical switches or sensors constituting the detection units 32 "ON". In other words, the reference member J covers a wide range of members that serve or function to detect a displacement angle or the like of the operating device 3 and detect a switch operation performed by the operator.

In this embodiment, for example, the reference member J may be constituted by a convex or projecting permanent magnet, magnetic body, or the like formed on a rear surface of the jacket member D.

The protective sheet S is a protective sheet for the detection unit 32, which is formed to cover the surface of the input unit P322 of the ring shaped detection unit 322. The protective sheet S is preferably formed from a transparent film or the like that is dust-proof and waterproof and sufficiently elastic to enable a push button operation or the like.

Hence, when the jacket member D is formed to be rotatable, the reference member J is a projecting member, a permanent magnet, or the like that corresponds to one input unit P322.

When the jacket member D is formed to be non-rotatable, [the reference member J] is provided in a plurality corresponding one-on-one to positions corresponding to the respective input units P322.

A typical example of the operating switches constituted respectively by the ring shaped detection unit 322 and the input unit P322 thereof as well as the other detection units 321, 323, 324 and the input units P321, P323, P324 thereof is a push button/switch in which an input unit (a button of the push button) is operated by pressure received from the jacket member D via an operation performed by the operator, or a pressure sensitive sensor that detects the pressure received by the input unit. In a case where the jacket member D serves as the input unit itself or includes an input unit, a proximity sensor that detects the approach and retreat of the jacket member D corresponding to an operation performed by the operator, as described above, serves as another example of the operating switch.

When the jacket member D is provided, the sealing property of the ring shaped detection unit 322 and the casing 31 in the vicinity thereof can be improved in comparison with the second embodiment. Further, when the jacket member D is provided, a comparatively large and expensive dust-proof, waterproof operating switch need not be used. As a result, the following incidental effects are obtained.

(1) The ring shaped detection unit 322 can be constructed comparatively inexpensively and compactly.

(2) The number (N) of detection units constituting the single ring shaped detection unit can be increased, whereby the ring shaped detection unit 322 can be constructed such that a direction difference between adjacent detection units is comparatively small (i.e. [the range of] (360/N) is small, enabling fine direction setting).

Fourth Embodiment

Figure 6:
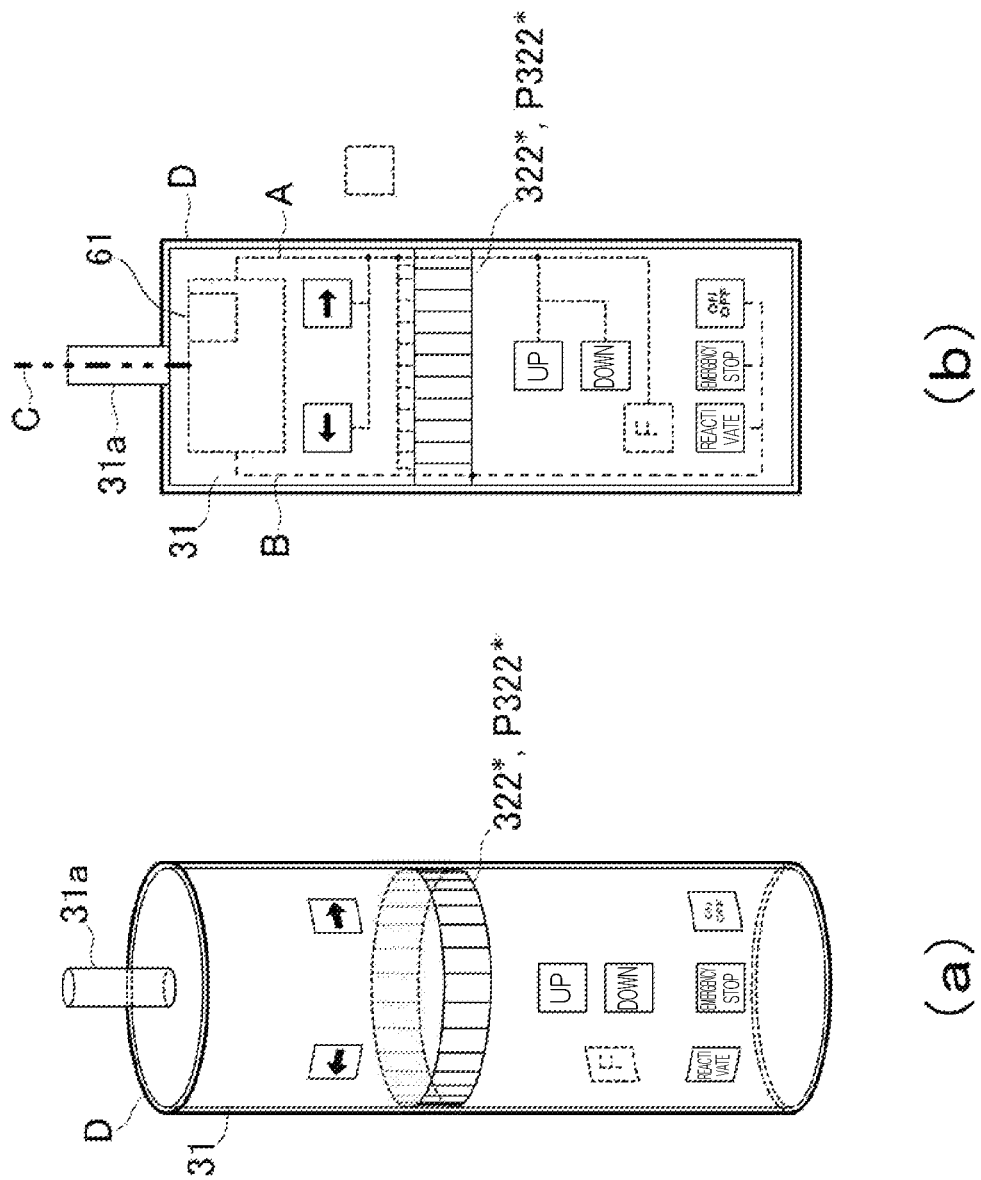
FIG. 6 is a view showing a constitution of an operating device according to a fourth embodiment of the present invention.

FIG. 6 is a view showing a constitution of an operating device according to a fourth embodiment of the present invention and a view showing a modified example of the operating device shown in FIG. 5. The operating device of FIG. 6 differs from the operating device of FIG. 5 in that the jacket member D, or in other words the cover member D, covers not only the ring shaped detection unit 322 and the vicinity thereof, but also other regions of the casing surface.

As shown in FIG. 6, the jacket member D covers substantially the entire outer surface of the casing 31 from a bottom portion of the casing 31 to the upper hollow projecting portion 31$a$. At least the part of the jacket member D corresponding to the input unit P322 of the ring shaped detection unit 322 is formed from a synthetic resin that is flexible enough for the operator to operate the input unit P322 easily. The synthetic resin used for this part is preferably transparent or translucent. In other parts, the jacket member D is formed from a comparatively hard material through multicolor molding or the like in order to maintain its outer form.

The jacket member D may be fixed so as not to move relative to the hollow projecting portion 31$a$, the casing 31, and the outer surface of the respective detection units 32, or may be unfixed. For example, the jacket member D may be disposed to be capable of rotating 360 degrees, or in a larger or smaller angle range than 360 degrees, around the circumference of the casing 31.

The input unit P322 is interposed between the jacket member D and the outer surface of the ring shaped detection unit 322, but the reference member J, the protective sheet S, and so on may be interposed between the input unit P322 and the jacket member D in the manner described in the third embodiment (not shown).

When the jacket member D is provided, the sealing property of the ring shaped detection unit 322, the other ring shaped detection units 323, 324, 325, and substantially the entire casing 31 can be improved. As a result, similar incidental effects to those of the third embodiment are obtained. Further, the dust resistance and water resistance of the operating switches constituted by the other detection units 321, 323, 324 and the input units P321, P323, P324 thereof can be improved, enabling further reductions in the cost and size of the operating device 3.

Fifth Embodiment

Figure 7:
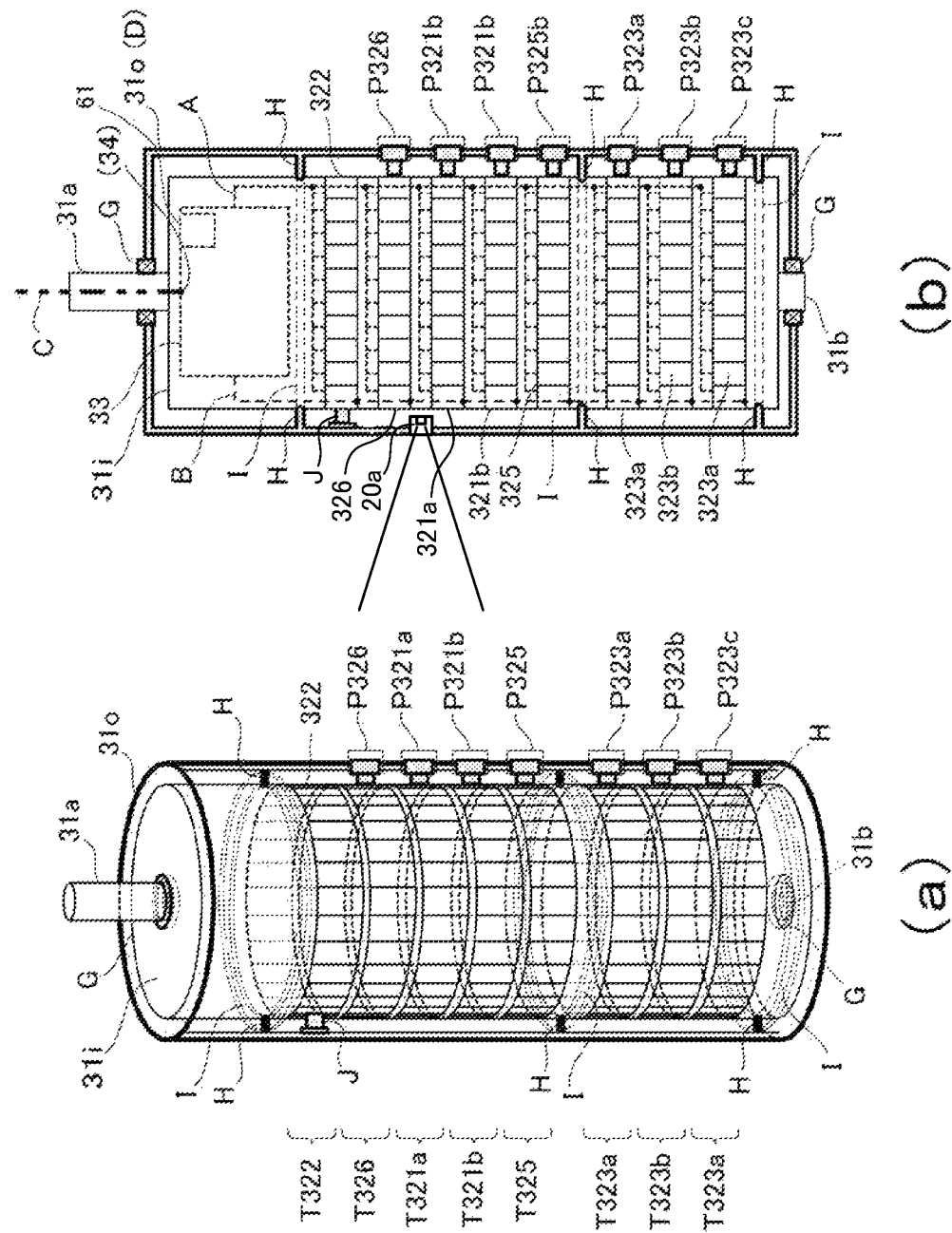
FIG. 7 is a view showing a constitution of an operating device according to a fifth embodiment of the present invention.

FIG. 7 is a view showing a constitution of an operating device according to a fifth embodiment of the present invention and a view showing a modified example of the operating device shown in FIG. 6. The operating device of FIG. 7 differs from the operating device of FIG. 6 at least in that the ring shaped detection unit is formed by disposing all of the detection units 32 in series in a longitudinal direction, the casing 31 is constituted by two casing elements (an exterior casing 31$o$ and an interior casing 31$i$), and the driving start detection unit 326 is provided separately to the detection unit group 322.

The exterior casing 31$o$ and the interior casing 31$i$, which is accommodated completely inside the exterior casing 31$o$ and not therefore exposed to the outside, are substantially identical hollow cylinders.

The reference member J is disposed fixedly on an inner surface of the exterior casing 31$o$ as ON means for specifying a selected direction and switching a detection unit ON in accordance with the selected direction.

[Constitution of Main Parts]

As shown in FIG. 7($a$), the casing 31 of the operating device 3 includes the hollow, substantially columnar interior casing 31$i$, and the substantially hollow cylindrical exterior casing 31$o$, which is attached so as to envelop the interior casing 31$i$ and to be capable of rotating about the circumference of the interior casing 31$i$ by 360 degrees or in a larger or smaller angle range than 360 degrees. More specifically, the interior casing 31$i$ includes hollow projecting portions 31$a$3$b$ provided respectively on an upper portion and a lower portion thereof, and the exterior casing 31$o$ is attached to the interior casing 31$i$ via a bearing mechanism G such as a bearing attached to each hollow projecting portion 31$a$3$b$. A projection H provided on an interior casing 31$i$ side surface of the exterior casing 31$o$ moves around the interior casing 31 while engaged with a raceway groove i provided in an outer surface of the interior casing 31$i$, and therefore the exterior casing 31$o$ and the interior casing 31$i$ are free to rotate coaxially while a distance therebetween remains constant. Hence, the operator can rotate the exterior casing 31$o$ relative to the interior casing 31$i$ by varying the orientation or attitude of the hand holding the exterior casing 31$o$, his/her arm, or his/her body. The operating device 3 according to this embodiment is similar to a conventional operating device in that the two casings are capable of relative rotation, but in contrast to a conventional operating device, the two casings of the operating device shown in FIG. 7 are not disposed one above the other.

Note that when the projecting portion (an arc shaped projection) H is formed on the interior casing 31$i$ side surface of the exterior casing 31$o$ in a closed ring shape or a long arc shape, for example, the projecting portion H also assists in reinforcing the exterior casing 31$o$.

[Ring Shaped Detection Unit]

The ring shaped detection unit corresponding to the respective detection units 32 (321, 322, 323, 326, . . . ) is provided around the interior casing 31$i$. The small adjustment input detection unit 324 and the special input detection unit 325, although not shown in the drawing, may be provided if necessary, but when provided, the small adjustment input detection unit 324 and the special input detection unit 325 do not have to include a plurality of detection units like the ring shaped detection unit, and may be provided in the form of operating switches such as those shown in FIGS. 4 to 6.

When the operator grasps the operating device 3, and more particularly the exterior casing 31$o$, by the hand and then varies the orientation or attitude of the hand holding the exterior casing 31$o$, his/her arm, or his/her body, the exterior casing 31$o$ rotates relative to the interior casing 31$i$. Accordingly, the reference member J attached to the exterior casing 31$o$ rotates by a corresponding amount about the ring shaped detection unit 322 attached to the interior casing 31$i$. As a result, a specific detection unit 322$j$ located in a position corresponding to the relative rotation amount, from among the plurality of detection units constituting the ring shaped detection unit 322, detects the approach or contact of the reference member J. A specific object movement direction is associated in advance with each arbitrary detection unit 322$x$ constituting the ring shaped detection unit 322, and therefore the specific detection unit 322$j$ that detects the approach or contact of the reference member J generates a signal corresponding to the specific object movement direction associated therewith.

Hence, the ring shaped detection unit 322 functions as means for detecting the object movement direction selected by the operator. In this case, the two casings 31$i$, 31$o$ themselves may be considered equivalent to the input unit P322.

The individual detection units 322$x$ constituting the ring shaped detection unit 322 may be constituted by any mechanism or means (a sensor, an element, a switch, and so on) that detects the approach or contact of the reference member J. For example, the detection units 322$x$ may be constituted by a pressure sensitive sensor that detects pressure received from the reference member J, a magnetic sensor that detects a magnetic body provided in the reference member J, an optical sensor that detects light shielding or light reflection by the reference member J, or in more comprehensive terms, a proximity sensor that detects the approach of the reference member J without contact (see FIG. 11).

Note that if the reference member J is small, it may be impossible for any of the detection units to detect the reference member J when the reference member J is disposed between adjacent detection units. Therefore, measures such as setting the size of the reference member J at or above an interval width between adjacent detection units or providing the reference member J in a plurality are taken in advance to ensure that the reference member J can be detected by at least one detection unit.

The individual detection units constituting the ring shaped detection units 321 (321*a*, 321*b*), 323 (323*a*, 323*b*, 323*c*), 326 . . . other than the ring shaped detection unit 322 may be constituted by any mechanism or switch (a sensor, an element, a switch, and so on) that detects operation input from the input units P321*a*, P321*b*, P323*a*, P323*b*, P323*c*, P326, . . . . For example, these detection units may be constituted by a pressure sensitive sensor that detects pressure received from the input unit, a magnetic sensor that detects a magnetic body provided in the input unit, an optical sensor that detects light shielding or light reflection by the input unit, or in more comprehensive terms, a proximity sensor that detects the approach of the input unit without contact (see FIG. 12).

Note that hereafter, the ring shaped detection units (including the small adjustment input detection unit 324 and the special input detection unit 325 provided when required) other than the ring shaped detection unit 322 and the input units thereof will sometimes be referred to collectively or individually as 32U and P32U.

Figure 11:
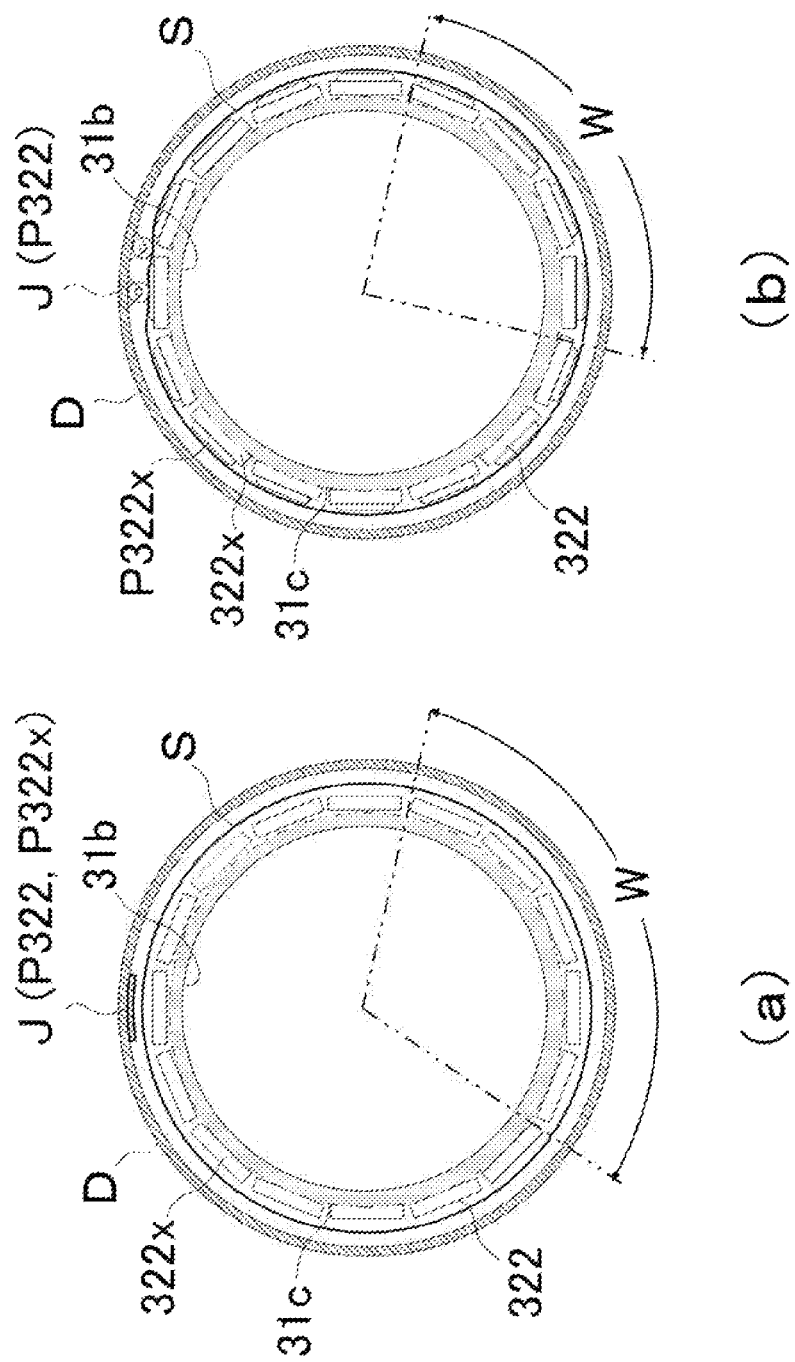
FIG. 11 is a sectional view showing a basic constitution of a ring shaped detection unit provided in the operating device according to the present invention.
Figure 12:
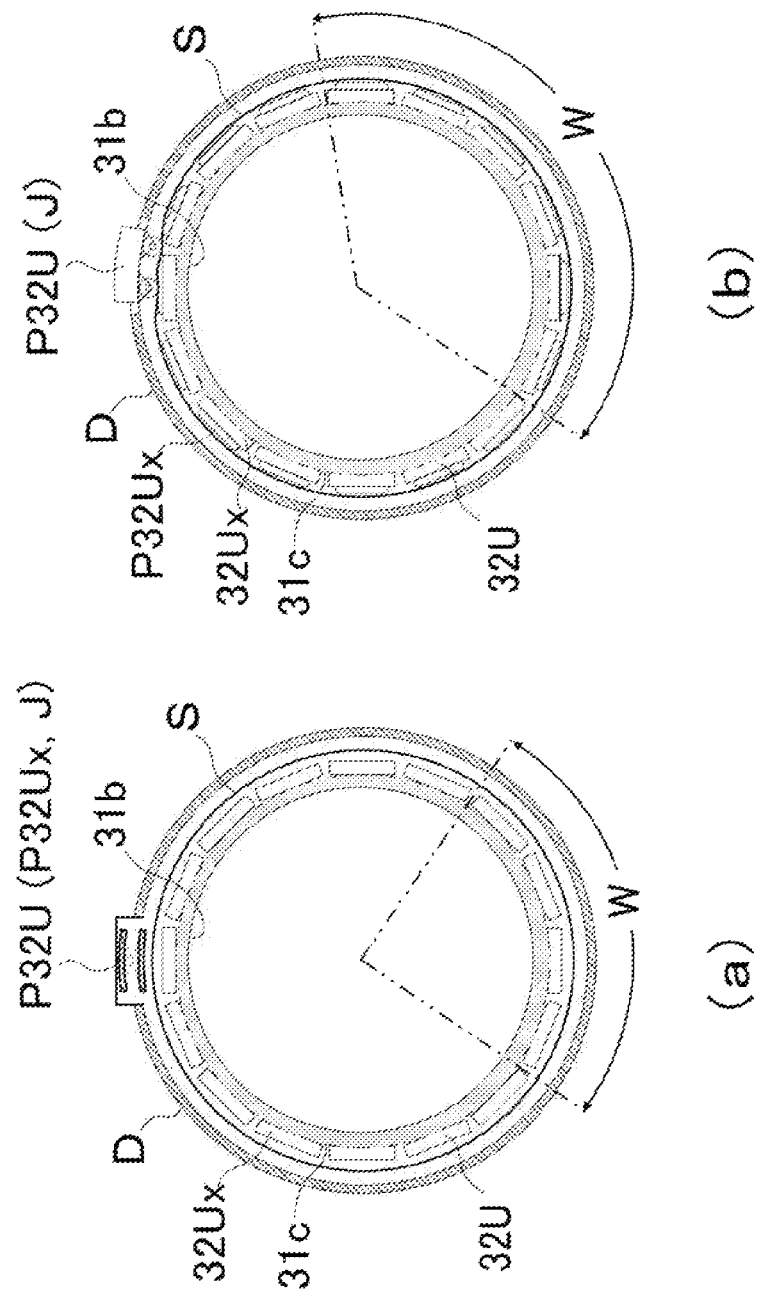
FIG. 12 is a sectional view showing a basic constitution of another ring shaped detection unit provided in the operating device according to the present invention.

Regardless of the type of the ring shaped detection unit, as long as the functions of the ring shaped detection unit and the individual detection units constituting the ring shaped detection unit are not impaired, the protective sheet S may be provided on the outer surface of the respective detection units (see FIGS. 11 and 12). When provided, the protective sheet S assists in extending the life of the respective detection units, and therefore the ring shaped detection units, and improving dust resistance and water resistance. The protective sheet S is made of rubber or synthetic resin, and functions similarly to the jacket member D of the operating device shown in FIG. 5 in terms of improving dust resistance and water resistance. In a case where the individual detection units constituting the ring shaped detection unit 32 include a dust-proofing mechanism and a waterproofing mechanism, the protective sheet S need not be provided, but may still be provided.

The notification unit 20*a* shown in FIG. 7(*b*) is constituted by an illuminating device that functions as means for assisting the operations of the operator by emitting a directional light beam, as shown in the drawing, in the travel direction of the traveling body 9 described with reference to FIG. 1, for example, such that a light spot is formed.

A comparatively powerful LED or a device that condenses a red laser beam, illumination light generated by a bulb, or a powerful light beam from a halogen lamp, a xenon lamp, or the like using a predetermined optical system, and so on may be used as the illuminating device.

Thus, people around the operator can grasp the direction in which the traveling body 9 is heading, or in other words the direction in which the package or the like is heading, from the indication provided by the notification unit 20*a* without checking the display on the display unit 100. Further, the operator him/herself can be informed anew of the direction in which the travel unit 5 is heading during an operation, and can therefore perform operations safely and reliably while checking the content of the notification.

[Electric Configuration]

As shown in FIG. 7(*b*), the casing 31 includes, in its interior, the microcomputer 31 connected to the wires A, B, C, the output end portion 34, and the respective ring shaped detection units 32 connected to the wires A, B. The wire C is disposed in the hollow projecting portion 31*a*. Power required to operate the respective ring shaped detection units 32 (more specifically, the individual detection units constituting the respective ring shaped detection units 32) and other components requiring a power supply is supplied first to the microcomputer 33 either from the power supply 6 through the wire C or from the internal power supply 61 represented by a battery, and then distributed to the respective detection units 32 through the wires A, B.

(1) The detection unit 32 detects operation input generated when the operator rotates the two casings 31*i*, 31*o* relative to each other or operation input generated when the operator operates the input unit P32, and generates a signal corresponding to the operation input. The signal is transmitted to the microcomputer 33 through the wires A, B. The microcomputer 33 generates an operation signal based on the signal. The operation signal is then transmitted from the output end portion 34 to the input end portion 54 through the wire C.

When operation input generated particularly when the operator rotates the two casings 31*i*, 31*o* relative to each other is detected by one of the detection units 322*x* constituting the ring shaped detection unit 322 (more specifically, when the reference member J is detected by the detection unit 322*j*), the detection unit 322*x* (322*j*) generates a signal relating to the object movement direction pre-associated therewith, whereupon the microcomputer 33 generates an operation signal based on this signal. When the operator operates the input unit P326 after operating the input unit P322 such that the resulting operation input is detected by the driving start detection unit 326, the driving start detection unit 326 generates a signal corresponding to the operation input, whereupon the microcomputer 33 generates an operation signal based on this signal. All of the operation signals are transmitted from the output end portion 34 to the input end portion 54 through the wire C.

(2) The respective operation signals are then transmitted from the input end portion 54 to the microcomputer 53, whereupon the microcomputer 53 generates control signals on the basis of the operation signals. On the basis of the control signals, the inverter or contactor 51 controls operations of the X axis motor 41 and the Y axis motor 42, while the inverter or contactor 52 controls an operation of the Z axis motor 43.

[Summary]

In the operating device 3 shown in FIG. 7, the exterior casing 31*o* covers the periphery of the ring shaped detection units attached to the interior casing 31*i*, and therefore corresponds to the jacket member D.

The operating device 3 shown in FIG. 7 is similar to a conventional operating device in that the two casings are capable of relative rotation. In the operating device shown in FIG. 7, however, the two casings 31*i*, 31*o* are not disposed in a conventional vertical relationship, and instead, the exterior casing 31*o* covers substantially the entire interior casing 31*i*. Further, the bearing mechanism G such as a bearing is interposed in a boundary between the interior casing 31*i* and the exterior casing 31*o*, and it may therefore be said that no gap exists between the exterior casing 31*o* and the interior casing 31*i*. As a result, the sealing properties (dust resistance and water resistance, for example) of the operating device shown in FIG. 7 are improved further. By making the respective detection units 32 dust-proof and waterproof in this case, the sealing properties of the operating device 3 can be improved even further.

Moreover, although the operating device 3 shown in FIG. 7 is divided into the two casings 31i, 31o, relative rotation between the two casings is detected by the ring shaped detection unit, and therefore the exterior casing 31o can be provided with an extremely simple constitution and attached easily. Hence, design subjects can be limited mainly to the interior casing 31i, enabling reductions in design restrictions and the assembly operation load in comparison with the prior art.

Sixth Embodiment

Figure 8:
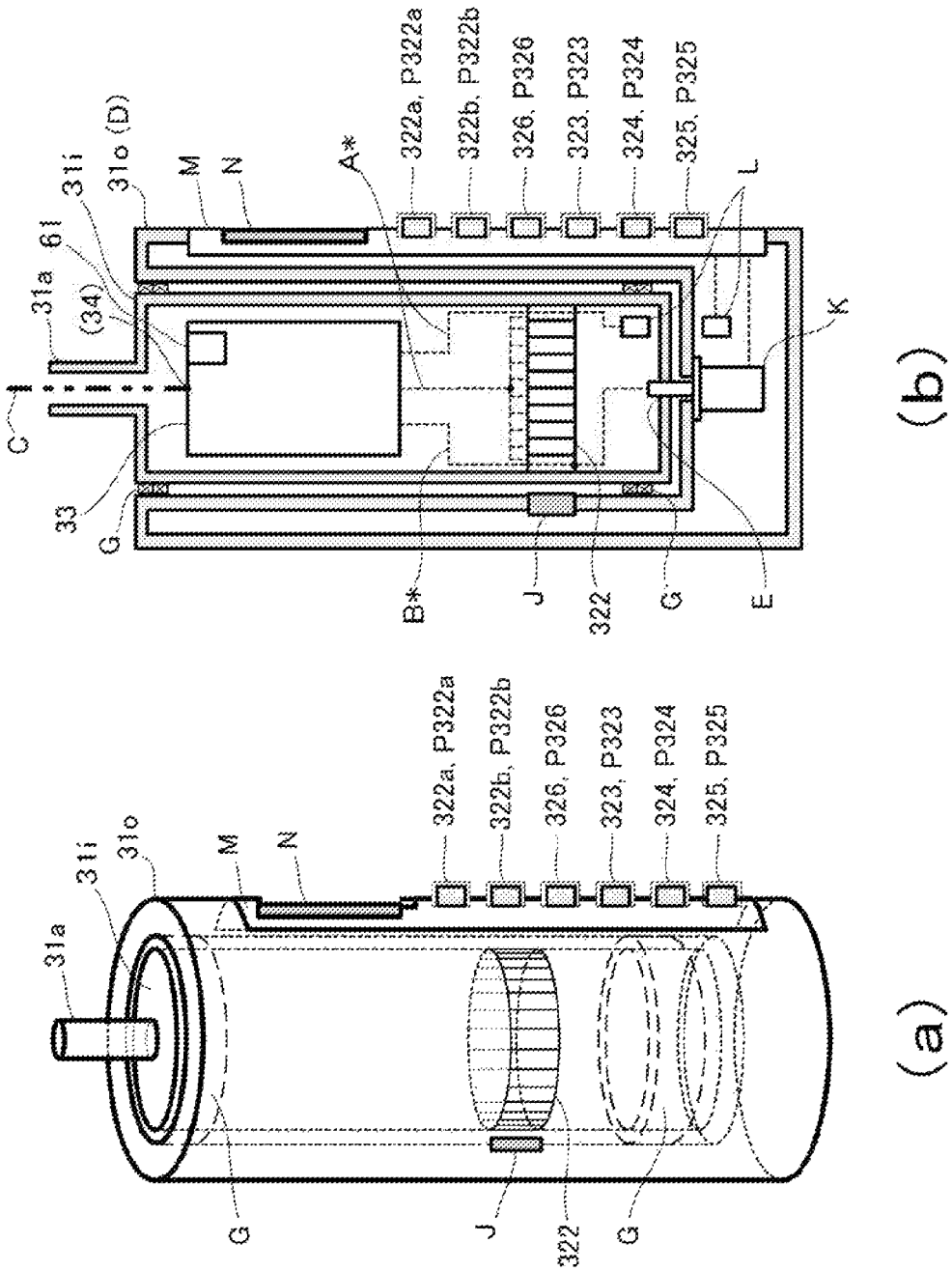
FIG. 8 is a view showing a constitution of an operating device according to a sixth embodiment of the present invention.

FIG. 8 is a view showing a constitution of an operating device according to a sixth embodiment of the present invention and a view showing a modified example of the operating device shown in FIG. 7. The operating device of FIG. 8 differs from the operating device of FIG. 7 in that only the detection unit group 322 serves as a ring shaped detection unit, a slip ring is used to secure the power supply (and signal transmission) between the two casing elements (the exterior casing 31o and the interior casing 31i), and wireless communication means is used to secure signal transmission.

[Constitution of Main Parts]

As shown in FIG. 8(a), the casing 31 of the operating device 3 includes the hollow, substantially columnar interior casing 31i, and the exterior casing 31o, which is formed in a hollow cup shape (for example, a shape obtained by inserting a small cup into a large cup and connecting the respective cups in planar form at an opening portion) and attached so as to envelop the interior casing 31i and be capable of rotating about the circumference of the interior casing 31i by 360 degrees or in a larger or smaller angle range than 360 degrees. The bearing mechanism G such as a bearing is interposed between the exterior casing 31o and the interior casing 31i so as to fill a gap between the two casings, and therefore the two casings are free to rotate coaxially. Hence, the operator can rotate the exterior casing 31o relative to the interior casing 31i by varying the orientation or attitude of the hand holding the exterior casing 31o, his/her arm, or his/her body. The operating device 3 according to this embodiment is similar to a conventional operating device in that the two casings are capable of relative rotation, but in contrast to a conventional operating device, the two casings of the operating device shown in FIG. 8 are not disposed one above the other.

A ring shaped detection unit corresponding to the detection unit group 322 is provided about the circumference of the interior casing 31i. This ring shaped detection unit 322 is identical to the ring shaped detection unit 322 of the operating device shown in FIG. 7, and by associating the individual detection units 322x constituting the ring shaped detection unit 322 with object movement directions, the ring shaped detection unit 322 functions as means for detecting the object movement direction selected by the operator. The individual detection units 322x of the ring shaped detection unit 322 may be formed from sensors that detect the approach or contact of the reference member J.

An operating panel M is provided on the outer surface of the exterior casing 31o, and includes display means N provided in a position that can be seen by the operator while holding the casing 31. Further, the detection units 321 (321a, 321b), 323, 324, 325, 326 including the input units P321 (P321a, P321b), P323, P324, P325, P326 are either provided on the operating panel M or built into the operating panel M in operable positions close to the operator in order to detect operation input from the respective input units.

The detection units 32U and corresponding input units P32U other than the detection unit group 322 are basically identical to those of the operating device shown in FIG. 4, except that the detection units 32U and input units P32U are attached to the operating panel M and the driving start detection unit 326 and corresponding input unit P326 are provided.

The driving start detection unit 326 and corresponding input unit P326 are basically identical to those of the operating device shown in FIG. 7, except that they are not formed as a ring shaped detection unit. Similarly to the respective detection units 32 and corresponding input units P32 shown in FIGS. 4 to 6, the driving start detection unit 326 and corresponding input unit P326 are formed integrally as a single operating switch.

The microcomputer 33 is provided in the interior of the interior casing 31i. In addition to the signal processing described above, the microcomputer 33 performs processing relating to an operation of the display means N provided on the surface of the exterior casing 31o. More specifically, the microcomputer 33 generates a signal relating to useful information for the operator to be displayed on the display means N (for example, movement angles and directions such as east, west, south, north, up down, 360°, etc., the content of the operation performed by the operator, the ON/OFF status of the power supply of the operating device 3, the condition of the moving apparatus 1 and the operating device 3, warnings, and so on), and transmits the signal to the display means N. The display means N displays the corresponding information in accordance with the signal from the microcomputer 33. The information displayed by the display means N includes numerals, alphabetic characters, and symbols, and preferably includes image information.

More preferably, apart or all of the information displayed on the display unit 100 described with reference to FIG. 1 is displayed synchronously on the display means N.

When the information is displayed on the display means N, the operator can conveniently perform a following operation while checking his/her own behavior. For example, every time the operator rotates the exterior casing 31o relative to the interior casing 31i in order to move the object in a desired direction such that corresponding operation input is transmitted to the microcomputer 33, the microcomputer 33 transmits a signal corresponding to the operation input to the display means N, and the display means N displays a picture of an arrow corresponding to the signal. Thus, the operator can check the display means N for variation in the picture of the arrow that depicts the object movement direction in accordance with his/her behavior while varying the orientation or attitude of the hand holding the exterior casing 31o, his/her arm, or his/her body, and can therefore specific the desired object movement direction while checking the display means N. Further, after specifying the object movement direction in this manner, the operator can move the object in the desired movement direction by operating the input unit 326 such that corresponding operation input is detected by the driving start detection unit 326 and the driving device 2 is driven. As a result, improvements in both convenience and safety can be achieved.

[Electric Configuration]

As shown in FIG. 8(b), the casing 31 includes, in its interior, the microcomputer 31 connected to wires A*, B*, C, the output end portion 34, and the respective detection units 32 connected to the wires A, B. The wire C is disposed in the hollow projecting portion 31a.

A slip ring K for electrically connecting a wire extending along a rotary axis and a wire extending about the rotary axis is disposed in an interior space in the lower portion of the exterior casing 31o. A typical slip ring includes a rotary tube and a trunk portion attached to the periphery of the rotary tube to be free to rotate. A through hole E is provided between a bottom portion of the interior casing 31i and a bottom portion of the exterior casing 31o so as to extend along a coaxial rotary axis of the interior casing 31i and the exterior casing 31o. The rotary tube is inserted into the through hole E, and the trunk portion is fixed to the interior space in the bottom portion of the exterior casing 31o. A wire in an interior space of the interior casing 31i is connected to a rotary tube side wire, and a wire in the interior space of the exterior casing 31o is connected to a trunk portion side wire. Hence, even when the exterior casing 31o is formed to be capable of rotating relative to the interior casing 31i, an electric connection is secured between the wire in the internal space of the interior casing 31i and the wire in the internal space of the exterior casing 31o.

Further, wireless communication means L is provided between the interior casing 31i and the exterior casing 31o.

Wires A**, B*, similarly to the wire C, include a signal line for transmitting signals and a power line for supplying power. The wire A* functions only as a signal line.

The power required to operate the respective elements (the detection units 32, the display means N, and so on) of the operating device 3 is supplied first to the microcomputer 33 either from the power supply 6 through the wire C or from the internal power supply 61 represented by a battery, and then distributed to the ring shaped detection unit 322 through the wire A** and to the other detection units 32, the display means N, and so on through the wire B* via the slip ring K.

A signal generated by the ring shaped detection unit 322 after detecting the reference member J (a signal corresponding to operation input generated by the approach or contact of the reference member J) is transmitted to the microcomputer 33 through the wire A**. The detection units 321, 323, 324, 325, 326, having detected operation input from the input units P321, P323, P324, P325, P326 on the operating panel M, generate signals corresponding to the operation input. These signals are transmitted to the microcomputer 33 through the wire A* via the wireless communication means L. However, a part of the signals may be transmitted to the microcomputer 33 through the wire B* via the slip ring K. The microcomputer 33 generates an operation signal on the basis of the signals transmitted from the respective detection units 32. The operation signal is transmitted from the output end portion 34 to the input end portion 54 through the wire C.

A signal relating to the display means N on the operating panel M is transmitted from the microcomputer 33 to the display means N either through the wire A* via the wireless communication means L or through the wire B* via the slip ring K.

[Summary]

In the operating device 3 shown in FIG. 8, the exterior casing 31o covers the periphery of the ring shaped detection unit attached to the interior casing 31i, and therefore corresponds to the jacket member D.

The operating device 3 shown in FIG. 8 is similar to a conventional operating device in that the two casings are capable of relative rotation. In contrast to a conventional operating device, however, the two casings are not disposed one above the other, and therefore a gap is not formed in the casing 31. Further, the exterior casing 31o covers substantially the entire interior casing 31i and the bearing mechanism G such as a bearing is interposed in the boundary between the interior casing 31i and the exterior casing 31o. It may therefore be said that no gap exists between the exterior casing 31o and the interior casing 31i. As a result, the sealing properties (dust resistance and water resistance, for example) of the operating device 3 described above are improved further.

Moreover, although the operating device 3 is divided into the two casings 31i, 31o, relative rotation between the two casings is detected by the ring shaped detection unit, and therefore the exterior casing 31o can be provided with an extremely simple constitution. Hence, design subjects can be limited mainly to the interior casing 31i and the exterior casing 31o can be attached easily. Furthermore, since the exterior casing 31o covers substantially the entire interior casing 31i, the need to balance the weight of upper and lower casings, as in the prior art, is eliminated, leading to a reduction in design restrictions. Hence, in contrast to the prior art, the need to design a casing serving as a first device element and a casing serving as a second device element while taking into consideration balance and alignment is eliminated, and therefore the assembly operation load is also reduced.

Seventh Embodiment

Figure 9:
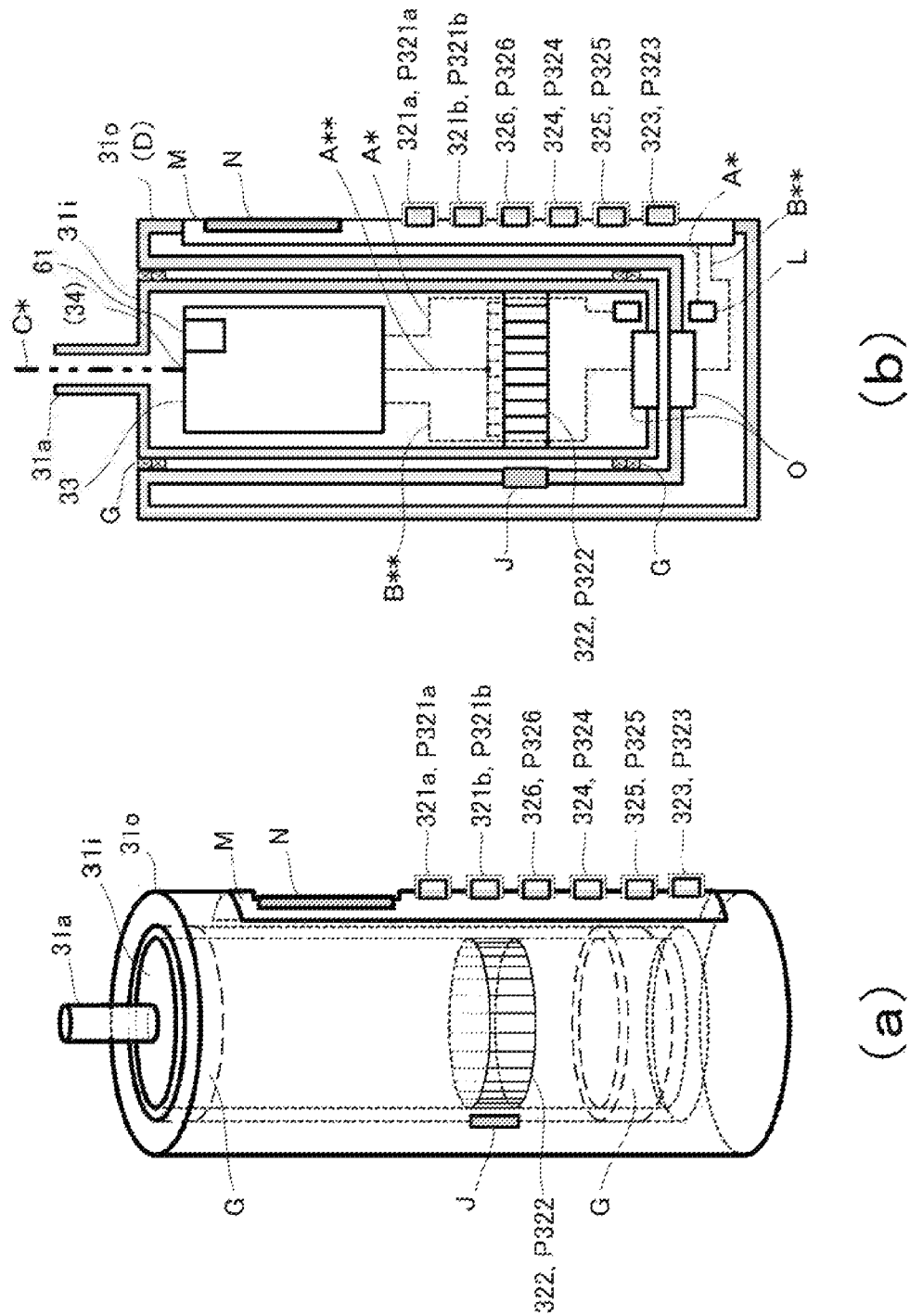
FIG. 9 is a view showing a constitution of an operating device according to a seventh embodiment of the present invention.

FIG. 9 is a view showing a constitution of an operating device according to a seventh embodiment of the present invention and a view showing a modified example of the operating device shown in FIG. 8. As shown in FIG. 9(a), the operating device of FIG. 9 differs from the operating device of FIG. 8 in that non-contact power supplying means O is used instead of the slip ring K to secure the power supply.

As shown in FIG. 9(b), a pair of non-contact power supplying means O are provided instead of the slip ring K in the respective bottom portions of the interior casing 31i and the exterior casing 31o constituting the casing 31 of the operating device 3. The non-contact power supplying means O may be non-contact power transmitting means employing any system, and an electromagnetic induction system or another system may be employed.

The wire A**, similarly to the wire C, includes both a signal line for transmitting signals and a power line for supplying power. The wire A* functions only as a signal line, and a wire B** functions only as a power line.

The power required to operate the respective elements (the detection units 32, the display means N, and so on) of the operating device 3 is supplied first to the microcomputer 33 either from the power supply 6 through the wire C or from the internal power supply 61, and then distributed to the ring shaped detection unit 322 through the wire A and to the other detection units 32 and the display means N through the wire B via the non-contact power supplying means O.

A signal generated by the ring shaped detection unit 322 after detecting the reference member J is transmitted to the microcomputer 33 through the wire A**. The detection units 321, 323, 324, 325, having detected operation input from the input units P321, P323, P324, P325 on the operating panel M, generate signals corresponding to the operation input. These signals are transmitted to the microcomputer 33 through the wire A* via the wireless communication means L, whereupon the microcomputer 33 generates an operation signal on the basis of these signals. The operation signal is then transmitted from the output end portion 34 to the input end portion 54 through the wire C.

A signal relating to the display means N on the operating panel M is transmitted from the microcomputer 33 to the display means N through the wire A* via the wireless communication means L.

In the operating device 3 shown in FIG. 9, the exterior casing 31o covers the periphery of the ring shaped detection unit attached to the interior casing 31i, and therefore corresponds to the jacket member D. The operating device 3 described above exhibits similar effects to the operating device shown in FIG. 8. Signal transmission and power supply between the exterior casing 31o and the interior casing 31i of the operating device 3 are both performed wirelessly and without contact, and therefore an increase in constitutional complexity can be avoided. Furthermore, it becomes even easier to provide the interior of the interior casing 31i with a special design, and the difficulty of assembly can be reduced.

Eighth Embodiment

Figure 10:
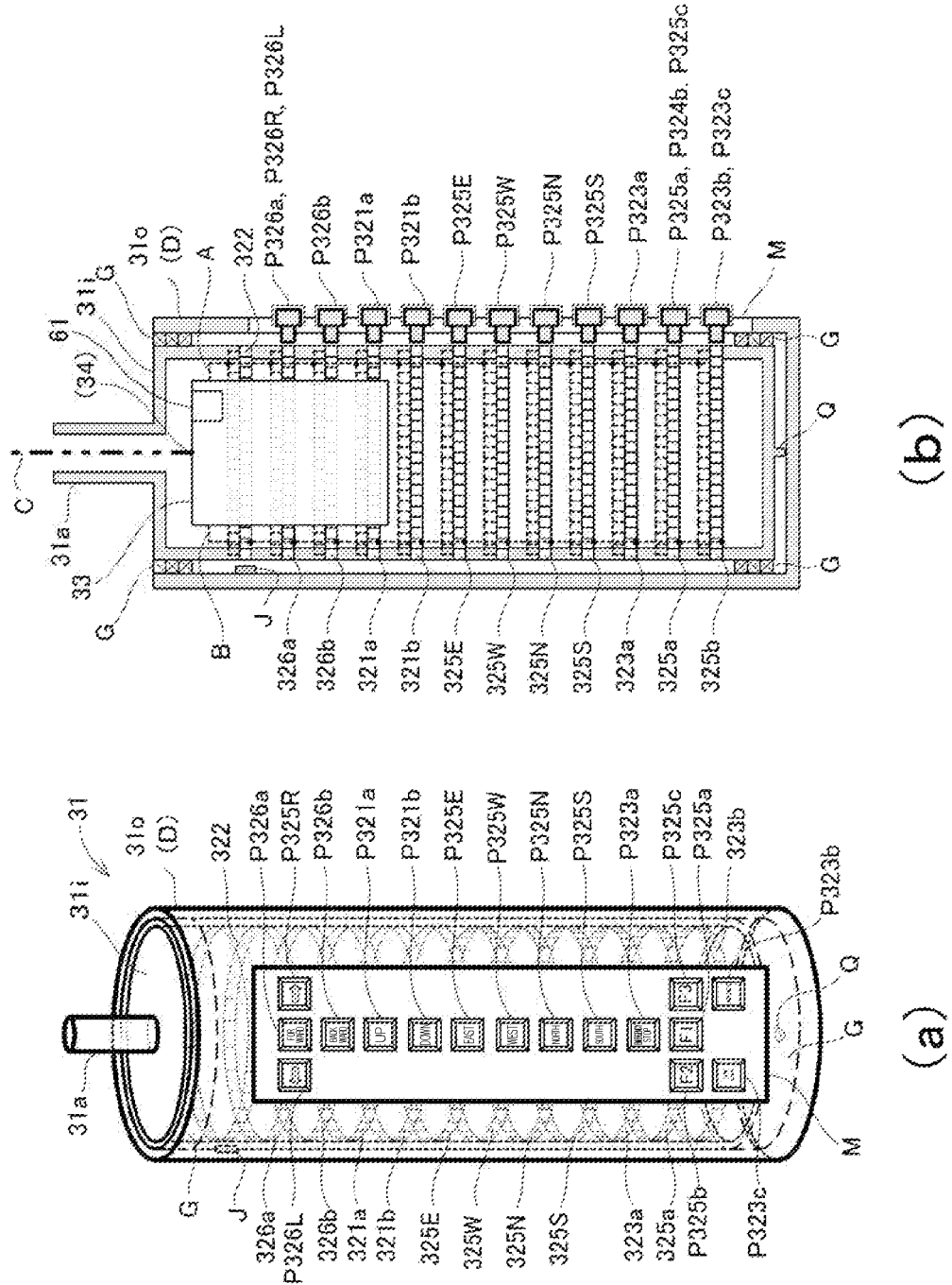
FIG. 10 is a view showing a constitution of an operating device according to an eighth embodiment of the present invention.

FIG. 10 is a view showing a constitution of an operating device according to an eighth embodiment of the present invention and a view showing a modified example of the operating device shown in FIG. 7. The operating device of FIG. 10 differs from the operating device of FIG. 7 in that the number of detection units 32 and input units P32 is increased, and a plurality of input units are disposed for each ring shaped detection unit.

[Constitution of Main Parts]

As shown in FIG. 10(a), the casing 31 of the operating device shown in FIG. 10 includes the hollow, substantially columnar interior casing 31i, the cup-shaped exterior casing 31o disposed to envelop the interior casing 31i, and a bearing mechanism such as a bearing that is disposed between the interior casing 31i and the exterior casing 31o to hold the two casings 31i, 31o to be free to rotate relative to each other. Hence, the operator can rotate the exterior casing 31o relative to the interior casing 31i by varying the orientation or attitude of the hand holding the exterior casing 31o, his/her arm, or his/her body.

A projection Q that projects along the coaxial rotary axis of the interior casing 31i and the exterior casing 31o so as to contact the surface of the exterior casing 31o is provided on a bottom portion of the outer surface of the interior casing 31i. The distance between the two casings is maintained by the projection Q, and therefore the two casings can be rotated relative to each other smoothly. The projection Q may be provided on the surface of the exterior casing 31o so as to contact a bottom portion of the outer surface of the interior casing 31i rather than being provided on the outer surface bottom portion of the interior casing 31i.

The two casings 31i, 31o are similar to a conventional operating device in being capable of relative rotation. In contrast to the prior art, however, the two casings of the operating device shown in FIG. 10 are not disposed one above the other. Further, the bearing mechanism G such as a bearing is interposed between the upper portion interior casing 31i and the exterior casing 31o of the casing 31, and it may therefore be said that substantially no gap is formed between the two casings 31i, 31o.

In the operating device of FIG. 10, similarly to the operating device of FIG. 7, the plurality of ring shaped detection units 32 (321, 322, 323, 325, 326) are disposed about the circumference of the interior casing 31i. The ring shaped detection units 321, 323, 325, and 326 correspond respectively to the elevator input detection unit (the hoisting input detection unit 321a and the lowering input detection unit 321b), the activation-related input detection unit, the special input detection unit, and the activation start detection unit. The ring shaped detection unit 321 includes the hoisting input detection unit 321a and the lowering input detection unit 321b, while the ring shaped detection unit 323 includes the detection unit 323a for detecting operation input relating to an emergency stop and a detection unit 323b that doubles as the detection unit for detecting operation input relating to resetting and the detection unit for detecting operation input relating to power supply ON/OFF. The ring shaped detection unit 325 includes a detection unit 325a for detecting operation input corresponding to three functions (F1, F2, F3), and detection units 325E, 325W, 325S, 325N for detecting operation input corresponding to movement of the object in each of eastward, westward, southward, and northward directions. The ring shaped detection unit 326 includes a detection unit 326a that doubles as a detection unit for detecting operation input corresponding to movement of the object in each of the leftward and rightward directions and a detection unit for detecting operation input corresponding to advancement in each of the leftward and rightward directions, and a detection unit 326b for detecting operation input corresponding to retreat in each of the leftward and rightward directions.

The protective sheet S may be provided on the outer surface of any of the ring shaped detection units as long as the functions of the ring shaped detection unit and the individual detection units constituting the ring shaped detection units are not impaired.

The reference member J is provided on the exterior casing 31o in a position corresponding to the ring shaped detection unit 322, and the input units P32U (P321, P323, P325, P326) are disposed in positions corresponding respectively to the ring shaped detection units 32U (321, 323, 325, 326) other than the ring shaped detection unit 322. The input unit P321 includes the input units P321a, P321b for the respective elevator input detection units 321a, 321b, the input unit 323 includes the input units P323a, P323b, P323c for the respective activation-related input detection units 323a, 323b, 323c, and the input unit 325 includes input units P325a, P325b, P325E, P325W, P325N, P325S for the respective special input detection units P325a, P325b, P325E, P325W, P325N, P325S. Further, an activation start P326 (P326a, P326b) is disposed. The operating panel M is attached to the exterior casing 31o, and the input units P32U are disposed on the operating panel.

As described above, the operating device of FIG. 10 includes ring shaped detection units (323b, 325a, 326a) having a plurality of input units. More specifically, (I) the ring shaped detection unit 323b includes the input unit P323b for inputting operation input relating to resetting and the input unit P323c for inputting operation input relating to power supply ON/OFF, and detects operation input corresponding to operations performed by the operator on the individual input units. The ring shaped detection unit 325a includes input units P325a, P325b, P325c for inputting operation input corresponding to the three functions (F1, F2, F3), and detects operation input corresponding to operations performed by the operator on the individual input units. Further, (II) the ring shaped detection unit 326a includes input units P326R, P326L for inputting operation input relating to the selection of object movement in the rightward direction or the leftward direction and an input unit P326a for inputting operation input corresponding to advancement of the object in the rightward direction or the leftward direction, and simultaneously detects operation input corresponding to an operation performed by the operator on the input unit P326R or the input unit P326L and operation input corresponding to an operation of the input unit P326b.

Further, in the operating device shown in FIG. 10, an instruction to operate the driving device 2 may be issued through a combination of detections performed by a plurality of ring shaped detection units. More specifically, (III) by operating the input unit P326R or the input unit P326L simultaneously with the input unit P326b, an instruction for causing the object to retreat in the rightward direction or the leftward direction (or, depending on settings, an instruction for causing the object to retreat from the rightward direction or the leftward direction) can be issued.

[Electric Configuration]

The electric configuration of the operating device shown in FIG. 10 is identical to that of the operating device shown in FIG. 7 apart from constitutions relating to the aforesaid items (I) to (III). Therefore, the constitutions relating to items (I) to (III) will now be described.

[A] Re: Constitutions Relating to Items (I) and (II)

First Example

The position of the reference member J is set as a specific position, and it is assumed that three input units P322 [1], P322 [2], and P322 [3], for example, exist relative to the ring shaped detection unit 322 (see FIG. 13(a)). It is assumed initially that the reference member J has been detected by a kth detection unit 322 [k] of the ring shaped detection unit 322, and therefore the input unit P322 [1] is disposed in a position removed from the position of the reference member J around the circumference of the interior casing 31i (assuming that the counterclockwise direction corresponds to a positive (+) direction) by n1 detection unit, the input unit P322 [2] is disposed in a position removed by n2 detection units, and the input unit P322 [3] is disposed in a position removed by n3 detection units. In other words, the input units P322 [1], P322 [2], and P322 [3] are initially disposed in positions corresponding respectively to detection units 322 [k+n1], 322 [k+n2], and 322 [k+n3].

When, at this time, the exterior casing 31o is rotated in a negative (−) direction relative to the interior casing 31i such that a detection unit 322 [k+p] detects the reference member J, the input units P322 [1], P322 [2], and P322 [3] shift to positions corresponding respectively to detection units 322 [k+p+n1], 322 [k+p+n2], and 322 [k+p+n3] (where p is an arbitrary integer).

This means that even when the exterior casing 31o is rotated relative to the interior casing 31i, i.e. even when the three input units P322 [1], P322 [2], P322 [3] are rotated relative to the ring shaped detection unit 322, the operation input generated when the input units P322 [1], P322 [2], P322 [3] are operated can be detected as operation input corresponding to the three functions (F1, F2, F3, for example) set in relation to the respective input units P322 [1], P322 [2], P322 [3]. Further, the functions corresponding to the operation input can be set in accordance with the number of input units disposed in the arrangement of a single ring shaped detection unit, and even when a first input unit and a second input unit disposed in the arrangement of the single ring shaped detection unit are operated simultaneously, the resulting operation input can be detected respectively.

Second Example

The position of the reference member J is set as a specific position, and it is assumed that three input units P32U [1], P32U [2], and P32U [3], for example, exist relative to an arbitrary ring shaped detection unit 32U other than the ring shaped detection unit 322 (see FIG. 13(b)). It is assumed initially that the reference member J has been detected by a kth detection unit 32U [h] of the ring shaped detection unit 32U, and therefore the input unit P32U [1] is disposed in a position removed from the position of the reference member J in the positive direction by m1 detection unit, the input unit P32U [2] is disposed in a position removed by m2 detection units, and the input unit P32U [3] is disposed in a position removed by m3 detection units. In other words, the input units P32U [1], P32U [2], and P32U [3] are initially disposed in positions corresponding respectively to detection units 32U [h+m1], 32U [h+m2], and 32U [h+m3].

When, at this time, the exterior casing 31o is rotated in the negative direction relative to the interior casing 31i such that a detection unit 322 [h+q] detects the reference member J, the input units P322 [1], P322 [2], and P322 [3] shift to positions corresponding respectively to detection units 322 [h+q+m1], 322 [h+q+m2], and 322 [h+q+m3] (where q is an arbitrary integer).

This means that even when the exterior casing 31o is rotated relative to the interior casing 31i, i.e. even when the three input units P32U [1], P32U [2], P32U [3] are rotated relative to the ring shaped detection unit 32U, the operation input generated when the input units P32U [1], P32U [2], P32U [3] are operated can be detected as operation input corresponding to the three functions set in relation to the respective input units P32U [1], P32U [2], P32U [3]. Further, the functions corresponding to the operation input can be set in accordance with the number of the plurality of ring shaped detection units provided in the single casing and the number of input units disposed in the respective arrangements of the plurality of ring shaped detection units, and even when a first input unit disposed in an arrangement of a first ring shaped detection unit and a second input unit disposed in an arrangement of a second ring shaped detection unit are operated simultaneously, the resulting operation input can be detected respectively.

Hence, by setting the specific position of the exterior casing 31o in advance, coordinates (disposal positions) of the input units P32 can be determined on the basis of the specific position. Therefore, by performing the processing for associating the input units with the detection units in the microcomputer 33 on the basis of the specific position, as in the two examples described above, the operator can issue an instruction to operate the driving device 2 even when a plurality of input units are provided for one or a plurality of ring shaped detection units (as in items (I) and (II)) by operating the respective input units.

Note that the processing for associating the input units with the detection units on the basis of the specific position, as in the two examples described above, may be realized in the microcomputer using a circuit or software. Further, this processing need only be executed by the microcomputer 33 but may also be executed by the microcomputer 53.

[B] Re: Constitution Relating to (III)

The processing for issuing an instruction to operate the driving device 2 through a combination of detections performed by a plurality of ring shaped detection units may be realized in the microcomputer using a circuit or software. Further, this processing need only be executed by the microcomputer 33 but may also be executed by the microcomputer 53.

[Summary]

According to the eighth embodiment, identical effects to the fifth embodiment can be obtained. In addition, even when a plurality of input units are provided for a single ring shaped detection unit, the operator can issue an instruction to operate the driving device 2 by operating the respective input units. This means that in an operating device requiring a fixed number of input units, the number of ring shaped detection units can be kept small or that the number of input units can be increased without increasing the number of ring shaped detection units, which helps in simplifying the internal structure of the operating device, reducing the number of components of the operating device, facilitating assembly, and reducing cost. Furthermore, increases and reductions in the number of input units can be responded to flexibly, which is advantageous in terms of design.

Further, as shown in FIG. 14, by extending a tip end of an input unit P32 [n] in an nth position from the preset specific position (the position of the reference member J, for example), from among the detection units constituting the ring shaped detection unit 32, from the position of the reference member J to a position Z corresponding to a certain detection unit 32 [v] in a with position using a wire Lv or the like, operation input from the input unit P32 [n] can be detected by the detection unit 32 [v]. With this constitution, even when one or a plurality of inputs units other than P32 [n] is disposed in an nth position from the position of the reference member J in a perpendicular direction to a paper surface, the tip ends of the input units can be extended to positions corresponding respectively to a detection unit 32 [v1] or subsequent detection units 32 [v2], 32 [v3], . . . in a v1th position or a subsequent v2th, v3th, . . . position using wires or the like, and therefore operation input from an input unit other than P32 [n] in the same nth position can be detected by the detection unit 32 [v1] or the subsequent detection units 32 [v2], 32 [v3], . . . . This means that even with an operating device in which a fixed number of input units must be disposed in the perpendicular direction to the paper surface, the number of ring shaped detection units can be kept small or that the number of input units can be increased without increasing the number of ring shaped detection units, whereby similar effects to those described above can be obtained.

(Supplement 1: Ring Shaped Detection Unit)

(1) FIGS. 11 and 12 are sectional views respectively showing basic constitutions of the ring shaped detection unit 322 and the other ring shaped detection units 321, 323, 324, . . . (to be referred to hereafter collectively or individually using the reference symbol "32U"; the corresponding input unit will be referred to using the reference symbol "P32U"). As shown in FIGS. 11 and 12, the ring shaped detection unit 32 (322, 32U) is arranged over a partial or entire range of the circumference of the casing 31. Here, "a partial range of the circumference" means a circumferential range other than a range W. When a plurality of detection units are arranged in this range, the detection units form an open ring shape or an arc shape. The magnitude of the range W depends on the design of the operating device 3. A case in which the range W is absent corresponds to "the total range of the circumference", in which the detection units are disposed in a closed ring shape.

The detection unit includes a wide range of mechanisms and means for detecting operation input from the operator using the operating device, and since the approach or contact of the reference member J corresponds to the operation input generated by the operator of the operating device, the reference member J may be considered equivalent to an input unit.

(2) Re: Ring Shaped Detection Unit 322

The ring shaped detection unit 322 detects the approach or contact of the reference member J attached to the jacket member D. Note that if the casing 31 is positioned as the interior casing 31i, the jacket member D corresponds to the exterior casing 31o.

Object movement directions are associated in advance with the detection units constituting the ring shaped detection unit 322. Accordingly, the ring shaped detection unit 322, having detected the reference member J, generates a signal corresponding to the object movement direction associated with the detection unit that detected the reference member J (this signal is transmitted to the microcomputer 33).

The system employed by the ring shaped detection unit 322 to detect the reference member J may be a non-contact system (see FIG. 11(a)) or a contact system (see FIG. 11(b)). In the case of a non-contact system, a magnetic sensor and a member that is attached to the jacket member D and includes a magnetic body serve as examples of the ring shaped detection unit and the reference member J, while in the case of a contact system, a pressure sensitive sensor and a wheeled projecting member attached to the jacket member D so as to face the pressure sensitive sensor serve as examples of the ring shaped detection unit and the reference member J.

The ring shaped detection unit 322 is attached to an outer surface 31c of the casing 31 but may be buried in the outer surface 31c so as to be attached in a position on an inner surface 31b side of the outer surface 31c. The ring shaped detection unit 322 may also be attached to the inner surface 31b as long as it remains able to detect the approach of the reference member J.

Positional relationships between the reference member J and the detection units attached to the jacket member D, the intervals between adjacent detection units, and so on, as well as the size, shape, and so on of the reference member J are designed so that one of the detection units detects operation input from the reference member J at all times.

The outer surface of each detection unit constituting the ring shaped detection unit 322 is covered by the protective sheet S. The protective sheet S is useful for improving the dust resistance, water resistance, other sealing properties, and shock resistance of the ring shaped detection unit, increasing the life of the ring shaped detection unit, and so on. The protective sheet S is particularly useful for protecting the detection units in a case where the detection units detect the reference member J using a contact system (see FIG. 11(b)). However, the ring shaped detection unit 322 is already protected to a certain extent by the jacket member D, and therefore the protective sheet S is not essential in a case where the detection units detect the reference member J using a non-contact system (see FIG. 11(a)).

(2) Re: Ring Shaped Detection Unit 32U

The individual detection units constituting the ring shaped detection unit 32U differ from those of the ring shaped detection unit 322 in that they are not associated with object movement directions. Instead, the ring shaped detection unit 32U detects operation input from the input unit P32U and generates a signal corresponding to the operation input (whereupon the signal is transmitted to the microcomputer 33).

Note that the input unit P32U shown in FIG. 12 is a push button type unit, for example.

Further, the detection system employed by the ring shaped detection unit 32U may be a non-contact system (see FIG. 12(a)) or a contact system (see FIG. 12(b)). An example of the ring shaped detection unit 32U and the input unit P32U shown in FIG. 12(a) is a magnetic sensor that detects the approach of a magnetic body and a push button that includes a magnetic body and is attached to the jacket member D to be capable of approaching and moving away from the magnetic sensor elastically, while an example shown in FIG. 12(b) is a pressure sensitive sensor and a push button that includes a wheeled projecting member and is attached to the jacket member D so as to be pushed toward the pressure sensitive sensor.

(3) Re: Operating Switch

When a combination of the ring shaped detection unit 32 and either the reference member J or the input unit P32 is set as an operating switch T, the ring shaped detection unit 322, from among the plurality of ring shaped detection units shown in FIG. 7, for example, constitutes an operating switch T322 in combination with the reference member J, while the other ring shaped detection units 321, 323, 324, 325 respectively constitute operating switches T321, T323, T324, T325 in combination with the respective input units P321, P323, P324, P325.

In the example shown in FIG. 11, individual arbitrary detection units 322x, 32Ux constituting the respective ring shaped detection units 322, 32U are not formed integrally with an input unit such as a push button. Instead, the reference member J functions as the input unit P322x of the detection unit 322x, while the input unit P32U functions as the input unit P32Ux of the arbitrary detection unit 32Ux. Hence, in this example, the arbitrary detection units 322x, 32Ux constitute operating switches in combination with the reference member J and the detection unit 322x, respectively.

In the example shown in FIG. 12, on the other hand, the arbitrary detection units 322x, 32Ux are already combined integrally with the input units P322x, P32Ux, respectively, to form single operating switches. Note that in this example, the reference member J and the input unit P32U transmit operation input to the input units P322x, P32Ux through direct contact with the respective input units, whereupon the input from these input units is detected by the detection units 322x, 32Ux. Therefore, the reference member J and the input unit P32U respectively function simultaneously as the input units P322x, P32Ux of the arbitrary detection units 322x, 32Ux and the input units P322, P32Ux of the ring shaped detection units 322, 32U.

(Re: Supplement 2 to Eighth Embodiment)

Figure 15:
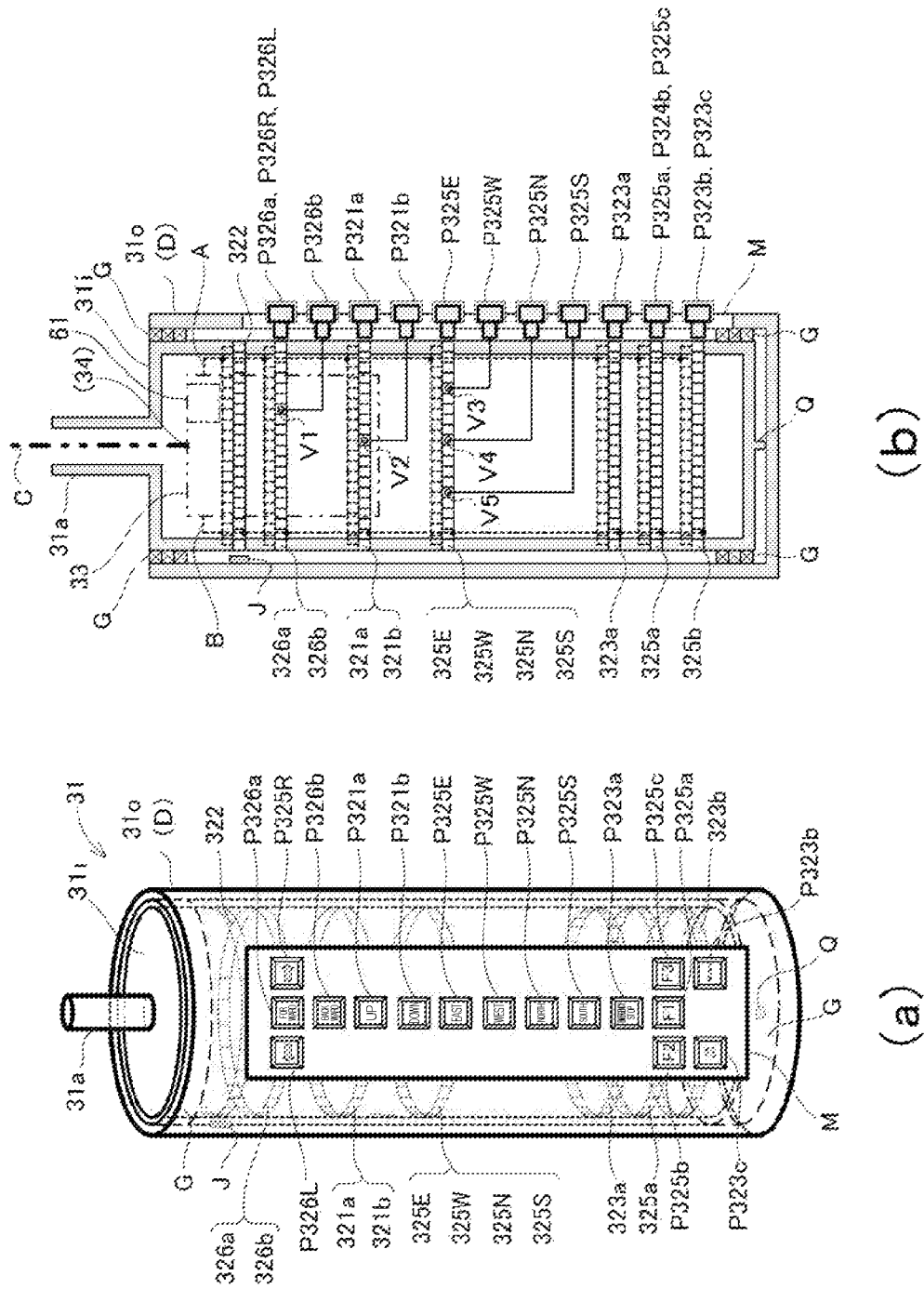
FIG. 15 is a view showing a constitution of a modified example of the operating device according to the fifth embodiment of the present invention.

An operating device shown in FIG. 15 is a specific example of the eighth embodiment. As shown in FIG. 15, on the exterior casing 31o, a tip end of the input unit 326b is extended to a position V1 of the detection unit 321a by a wire or the like. Similarly, the input unit P321b is extended to a position V2 of the detection unit 321a, and the input units P325W, P325N, P325S are extended respectively to positions V3, V4, V5 of the detection unit 325E. As a result, the detection unit 326b, the detection unit 321b, and the detection units 325W, 325N, 325S can be aggregated with the detection unit 326a, the detection unit 321a, and the detection unit 325E, respectively, whereby five ring shaped detection units can be eliminated. Hence, in comparison with the operating device shown in FIG. 10, the operating device shown in FIG. 15 has a clearly simplified internal structure and a reduced number of components. Therefore, assembly and design are facilitated and cost is reduced.

FIGS. 16 and 17 illustrate the display unit 100 described with reference to FIGS. 1 and 2.

The display unit 100 is not limited to any specific technical means as long as it is capable of displaying comparatively large directions. Preferably, however, various devices, such as a liquid crystal display device, a display device that displays directions optically in the form of arrows or the like using an LED (light emitting diode), or a device that uses segments generated by EL, a photoelectric tube, and so on, may be applied.

More specifically, as shown by a display unit 100-1 in FIG. 16, a display unit 100-2 in FIG. 17, and so on, display means combining a direction display in the form of an arrow and a display part consisting of alphabetic characters (in this case, "UP" and "DOWN" written in English), as indicated by reference symbols 100-1a, 100-1b, 100-2a, 100-2b, may be employed.

When, for example, a signal from the operating device 30 is input via the microcomputer 53, the display unit 100-2 shown in FIG. 17, for example, varies a display color (blue, for example) displayed at the stage of direction selection and a display color (red, for example) displayed as the traveling body 9 moves (including driving of the hoist). As a result, peripheral people can be informed of the actual movement timing and warned gradually.

Alternatively, for example, the display may be modified such that when movement of the traveling body 9 or the like is instructed in accordance with a command from the operating device 3, the arrow is caused to flash, and when movement is executed, the arrow is illuminated.

It is particularly important that at least a part of the display generated by the display unit 100, for example the direction display not including the alphabetic characters, can change in response to an instruction from the microcomputer 53 shown in FIG. 3 synchronously with the display generated by the display means of the operating device described with reference to FIG. 8. In other words, when the display means 100 (see FIG. 1) displays an image and alphabetic characters are displayed on the image display, [the direction display] can change in accordance with the change in the display of alphabetic characters and so on.

As a result, the operator operating the operating device 3 and people around the operator viewing the display unit 100 can grasp information relating to movement of the traveling body 9 and so on in perfect synchronization, which is effective in preventing onsite accidents and the like caused by differences in [the information] recognized by the operator and the people around the operator.

In particular, when the crane is carrying an object for conveyance such as a large package onsite, the field of vision of the people around the operator may be blocked in low onsite positions. As a result, a dangerous situation in which these people cannot predict the movement direction of the package may arise.

However, by disposing the display unit 100 in a position of maximum height in the operating site, as described above, the operator and the people around the operator can share [information] relating to the movement direction of the package and so on in real time, and therefore danger can be avoided effectively.

Further, in the case of FIG. 16 in particular, the display surface of the display unit is constituted by a dome-shaped, downward-projecting curved surface rather than a flat surface and can therefore by viewed from a wider range of the space in which the overhead crane is disposed.

Furthermore, the display unit may be provided in the vicinity of an intermediate position in the length direction of the Y direction rail 4, as shown by a reference symbol 100-3 in FIG. 1.

In so doing, the operator and the people around the operator can view the display unit 100-3 from a maximum range of the operating area, enabling an improvement in safety.

According to the constitutions described above, the operator operating the overhead crane 1 shown in FIG. 1 lowers the hook 7 by pressing a hoisting switch of the operating device 3 to activate the Z axis motor 43, latches the hook 7 to an object for conveyance placed on the floor surface, and then activates the Z axis motor 43 by pressing the hoisting button so that the supporting wire rope 6 hoists the object for conveyance to a height at which movement thereof in a horizontal direction is not impeded. Next, the operator moves the casing 31 in the direction in which the object for conveyance is to be moved and makes small adjustments to the orientation of the casing 31 by lightly pressing a travel button while observing the object for conveyance that moves while latched to the hook 7. Thus, the object for conveyance can be moved in parallel in the desired direction.

Next, an example of a case in which the operating device 3 employs a wireless system will be described briefly.

An embodiment employing a wireless system includes a reference position adjustment unit 70 shown in FIG. 18(a).

In the constitution shown in FIG. 1, for example, the motor driving control device 5 is provided on the ceiling side, and therefore the reference position adjustment unit 70 is required to determine a reference position thereof relative to the operating device 3, the position of which varies randomly, without using the communication cable 8. The reason for this is that positional deviation in the relative position must be corrected constantly.

When a wireless system is employed, various types of remote communication means, such as infrared optical communication, can be used to transmit operation signals as well as wireless radio waves on various bands.

Further, the operating device 3 is preferably imported into the room in which the overhead crane is installed using close-range wireless communication technology such as Bluetooth, for example, such that when the operating device 3 approaches a reception unit 143, close-range wireless communication is activated and a mutual protocol is established, after which the operating device 10-1 can be operated.

By executing an operation on the operating device 3 using a dedicated protocol in this manner, malfunctions caused by wireless noise and the like can be prevented reliably.

Here, close-range wireless communication means such as Bluetooth is incorporated into an issuing device 74 and the reception unit 143.

Alternatively, an instruction button 75 may be provided on the operating device 3, a button for starting reference position adjustment, or in other words calibration, may be provided on the instruction button 75, and instead of the automatic reference position setting described above, the operator may perform reference position setting to be described below by operating the reference position setting button at the start of use.

As shown in FIG. 18, the radio wave issuing device 74 is built into the operating device 3 and the radio wave reception unit 143 is built into the hoist so that when the instruction button 75 of the operating device 3 is operated, corresponding data are converted into a wireless signal and issued from the issuing device 74 in the form of a radio wave. The reception unit 143 receives the radio wave, converts the received radio wave into an electric signal, and inputs the electric signal into an input/output (I/O) port of the microcomputer 53 in the motor driving control device 5. Thus, movement control is performed on the traveling body 9 and the hook 7 serving as moving bodies.

In this embodiment, a microcomputer 73 is also built into the operating device 3, and the microcomputer 73, similarly to the microcomputer 25, includes a CPU (central processing unit), memory devices such as a ROM and a RAM, and an input/output (I/O) device. Further, a voltage gyro 91 and a geomagnetic sensor 95 are built into the operating device 3, and a bearing of the operating device 3 is detected by the voltage gyro 91 in accordance with rotation of the operating device 3 by the operator.

In this embodiment, a reference signal generation unit 71 that issues a reference signal in accordance with an instruction from the motor driving control device 5 side is provided. The reference signal from the reference signal generation unit is received by a reference signal reception unit 72 provided in the operating device 3. The signal received by the reference signal reception unit 72 is input into the reference position setting unit 76 via the microcomputer 73 in order to correct errors in positional information, such as the direction and orientation of the operating device 3, determined by the voltage gyro 91 and the geomagnetic sensor 95, and determine the reference position. Following reference position setting, the operating device 3 issues a driving instruction to the traveling body 9 and the hook 7.

Referring to FIG. 18(b), the constitution of the reference position adjustment unit 70 serving as a reference position adjustment mechanism will now be described.

In the drawing, the reference signal generation unit 71 is constituted by predetermined linear polarization generating means, for example, as will be described below. The reference signal generation unit 71 for generating linearly polarized light having a polarization plane in a fixed orientation as the reference signal, the reference signal reception unit 72 for receiving the reference signal from the reference signal generation unit 71, a light reception unit 82 for receiving an optical signal taken in by the reception unit 72 and generating a signal, and the microcomputer 73 for receiving and processing the signal from the light reception unit 82 are provided. The reference position setting unit 76 shown in FIG. 18(a) can be constituted by an LED (light emitting diode) lamp or the like upon reception of a command from the microcomputer 73. The LED is illuminated when the operating device 3 is recognized as being disposed in the reference position. Accordingly, a travel instruction issuing operation can be started by the operating device 3 in this position.

More specifically, as shown in FIG. 19, the reference signal generation unit 71 is disposed on the X direction rails 2A, 2B or the Y direction rail 4 of the crane shown in FIG. 1, for example, so as to emit light serving as the reference signal downward. In this case, a polarization filter 71a, for example, is provided in a reference light emission unit in order to convert light from a light source provided to the rear, not shown in the drawing, or natural light into linearly polarized light having a Y direction polarization plane.

A filter 72 through which only Y direction linearly polarized light passes is disposed on the outer surface of the operating device 3, and when light passing through the filter 72 enters the light receiving element 82, the light receiving element 82 generates an electric signal through a photoelectric conversion action. The electric signal is then transmitted to the microcomputer 73.

In this process, as shown in FIG. 20, the linearly polarized light is emitted from the reference signal generation means 71 in the vicinity of the ceiling on the device side, while the filter for passing only linearly polarized light and the light receiving element for receiving the light that passes through the filter are provided on the operating device 3. The operator waits for the LED, for example, serving as the reference position setting unit to light up while varying the orientation of the operating device below the crane.

FIG. 21 illustrates this process in further detail. A device that emits light using pulse control as a light source is preferably employed as the reference signal generation unit. The microcomputer 73 on the operating device 3 side performs reference position setting in accordance with signals of a predetermined pulse period, and therefore noise caused by stray light such as ambient light can be removed.

The operator can set the reference position by rotating the operating device 3 horizontally in the Y direction (see FIG. 20) to an orientation that matches the polarization plane of the reference light. In this case, the light reception unit passes a signal intensity peak every time it is rotated 180°, but south and north directions and so on can be differentiated from each other easily by the pre-inbuilt gyro 91 or the like.

Note that the microcomputer 73 of the operating device 3 has inbuilt clock means (a timer) so that when calibration, or in other words reference position setting, is not performed at fixed time intervals, the operator can be notified of movement of the operating device 3 by causing the LED lamp 76 to flash or the like. Thus, the operation instruction issued from the operating device 3 can be kept accurate at all times.

According to the present invention, as described above, an operating device exhibiting superior dust resistance and water resistance, and in particular an operating device having a simplified structure and a moving apparatus including the operating device, can be realized.

The scope of the present invention is not limited to the embodiments and modified examples described above. Further, some of the embodiments and modified examples described above may be combined with each other, partially combined with each other, or combined with other technical elements not described.

DESCRIPTION OF REFERENCE SYMBOLS 1 moving apparatus
2 driving device
3 operating device
4 driving motor
5 motor driving control device
31 casing
32 detection unit
33 microcomputer
34 output end portion
41 X axis motor
42 Y axis motor
43 Z axis motor
51 inverter or contactor
52 inverter or contactor
53 microcomputer
54 input end portion
3i interior casing
3o exterior casing
322 detection unit group
D jacket member
J reference member

The invention claimed is:

1. An operating device comprising:
a casing,
at least one input unit for inputting input relating to an instruction to drive movement of an object,
a detection unit for detecting the input from the at least one input unit, the detection unit including a plurality of individual detection units which are arranged over a partial or entire range of a circumference of the casing, each individual detection unit being pre-associated with a respective movement direction of the object, the movement direction being determined with no use of an encoder; and
a jacket member which covers the plurality of individual detection units,
wherein the jacket member is rotatable around the circumference of the casing at least within the range in which the plurality of individual detection units are arranged, and
the at least one input unit is provided on or as part of the jacket member.

2. The operating device according to claim 1, further comprising an adjustment input detection unit for detecting input relating to an instruction to correct the movement of the object.

3. The operating device according to claim 1, wherein the casing includes:
an interior casing having a surface on which the individual detection units are provided; and
an exterior casing that accommodates the interior casing, is formed to be free to rotate relative to the interior casing on an outer side thereof, and thereby serves as the jacket member; and
the exterior casing has an inner surface on which a reference member that serves as ON means relative to the individual detection units on the interior casing is provided.

4. The operating device according to claim 1, wherein an illuminating device for forming a light spot is disposed in a location exposed to the exterior of the casing on a surface that corresponds to an opposite side to an operator, as a notification unit for providing notification of a travel direction of a traveling body that travels together with the object.

5. The operating device according to claim 1, wherein a display unit for displaying, in a visually comprehensible manner, information relating to a displacement amount when an orientation of the object is modified or information relating to an advancement direction of the object is fixed to a traveling body that travels together with the object, in at least a region excluding an outer surface of the casing.

6. A moving apparatus comprising:
A traveling body used to move an object; and
an operating device for manipulating an operation of the traveling body, wherein the operating device is the operating device according to claim 1.

7. A moving apparatus comprising:
a traveling body used to move an object; and
an operating device for manipulating an operation of the traveling body,
wherein the operating device is the operating device according to claim 1.

8. A moving apparatus comprising:
a traveling body used to move an object; and
an operating device for manipulating an operation of the traveling body,
wherein the operating device is the operating device according to claim 1; and
a display unit for displaying, in a visually comprehensible manner, information relating to a displacement amount when an orientation of the object is modified or information relating to an advancement direction of the object is fixed to the traveling body, in at least a region excluding an outer surface of the casing.

9. The operating device according to claim 1, wherein the object movement direction is determined by selecting each individual detection unit by operation of the input unit by an operator holding the casing.

10. The operating device according to claim 1, wherein the detection unit generates a signal which simultaneously serves a signal causing the instruction to drive a movement of object and a signal causing the object movement direction.

11. The operating device according to claim 1, wherein the movement direction is determined with no use of an encoder for detecting relative rotation between the casing and the jacket.

* * * * *